United States Patent
Fujii et al.

(10) Patent No.: US 7,790,478 B2
(45) Date of Patent: Sep. 7, 2010

(54) MANUFACTURING METHOD OF SEMICONDUCTOR INTEGRATED CIRCUIT DEVICE

(75) Inventors: Kazuyuki Fujii, Tokyo (JP); Minoru Hanazaki, Tokyo (JP); Gen Kawaharada, Tokyo (JP); Masakazu Taki, Tokyo (JP); Mutsumi Tsuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 12/180,514

(22) Filed: Jul. 25, 2008

(65) Prior Publication Data

US 2009/0035945 A1 Feb. 5, 2009

(30) Foreign Application Priority Data

Jul. 31, 2007 (JP) ............................. 2007-199135

(51) Int. Cl.
*H01L 21/66* (2006.01)

(52) U.S. Cl. .......................... 438/10; 438/485; 438/680; 438/694; 438/788; 438/792; 118/723 AN; 257/E21.529; 257/E21.531

(58) Field of Classification Search ................... 438/10, 438/905, 485, 680, 694, 788, 792, 908; 414/935; 257/E21.521, E21.525, E21.529, E21.53, 257/E21.531; 118/712, 663, 723 AN
See application file for complete search history.

(56) References Cited

U.S. PATENT DOCUMENTS

| | | | |
|---|---|---|---|
| 5,817,534 A * | 10/1998 | Ye et al. ....................... | 438/10 |
| 5,830,310 A | 11/1998 | Doi | |
| 5,902,403 A | 5/1999 | Aitani et al. | |
| 6,592,817 B1 | 7/2003 | Tsai et al. | |
| 6,923,189 B2 * | 8/2005 | Lakshmanan et al. .... | 134/22.18 |
| 7,201,174 B2 | 4/2007 | Fukiage | |
| 2004/0253828 A1 | 12/2004 | Ozawa et al. | |

FOREIGN PATENT DOCUMENTS

| | | |
|---|---|---|
| JP | 8-193271 A | 7/1996 |
| JP | 9-143742 A | 6/1997 |
| JP | 2002-033312 A | 1/2002 |
| JP | 2002-057149 A | 2/2002 |
| JP | 2002-151475 A | 5/2002 |
| JP | 2002-270513 A | 9/2002 |
| JP | 2005-033173 A | 2/2005 |
| JP | 2006-210415 A | 8/2006 |

* cited by examiner

*Primary Examiner*—Julio J Maldonado
(74) *Attorney, Agent, or Firm*—Miles & Stockbridge P.C.

(57) ABSTRACT

In remote plasma cleaning, it is difficult to locally excite a plasma because the condition is not suitable for plasma excitation different from that at the time of film formation and a method using light has a problem of fogginess of a detection window that cannot be avoided in a CVD process and is not suitable for a mass production process. In order to solve these problems, the outline of the present invention is a manufacturing method of a semiconductor integrated circuit device in which a step of depositing a desired film by exciting a reaction gas using a plasma in a reaction chamber and a step of introducing a cleaning gas excited in a remote plasma excitation chamber into the reaction chamber and performing remote plasma cleaning of the reaction chamber in an atmosphere without plasma excitation are repeated, wherein a local plasma is generated in the reaction chamber or a vacuum system for evacuating the reaction chamber by a plasma excitation system of capacitively coupled type and the end point of the remote plasma cleaning is detected by monitoring the electrical characteristic of the plasma.

27 Claims, 28 Drawing Sheets

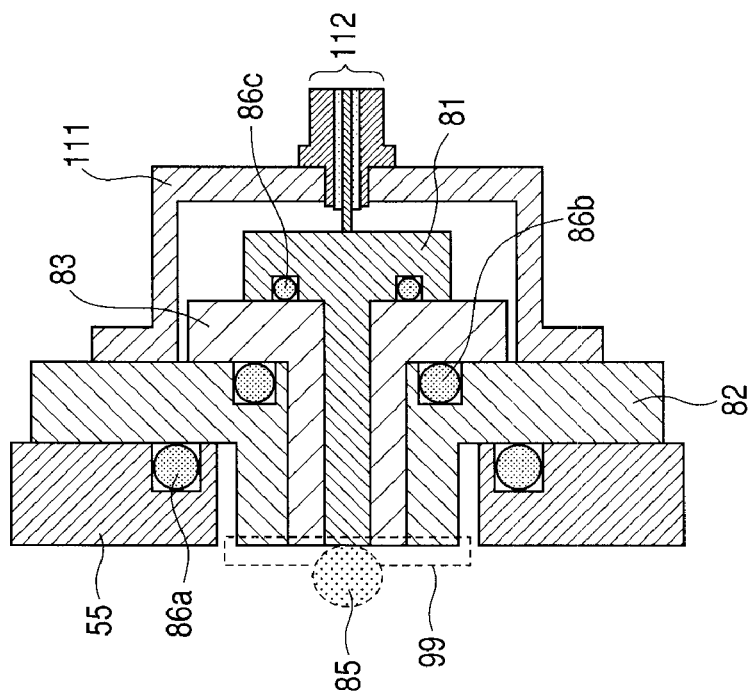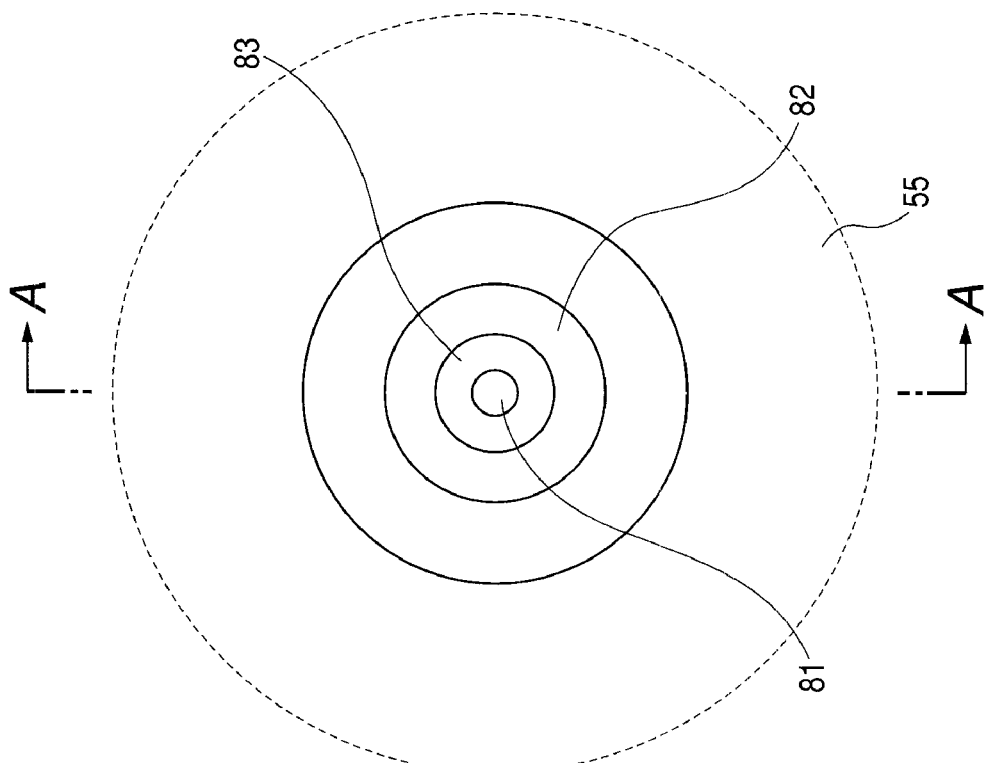

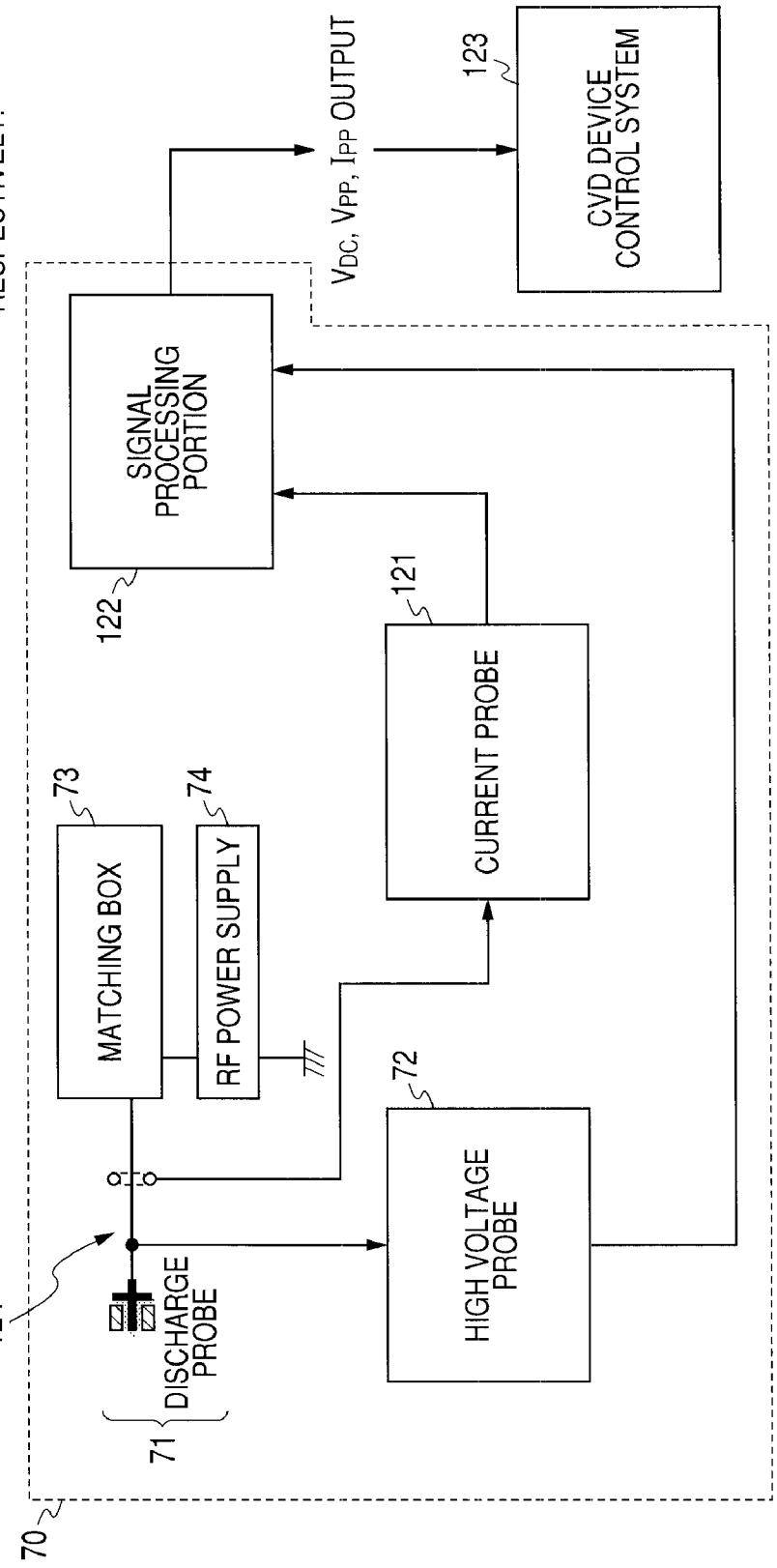

CLEANING END POINT DETECTION SIGNAL

ROLE OF Ar STEP WHEN CLEANING

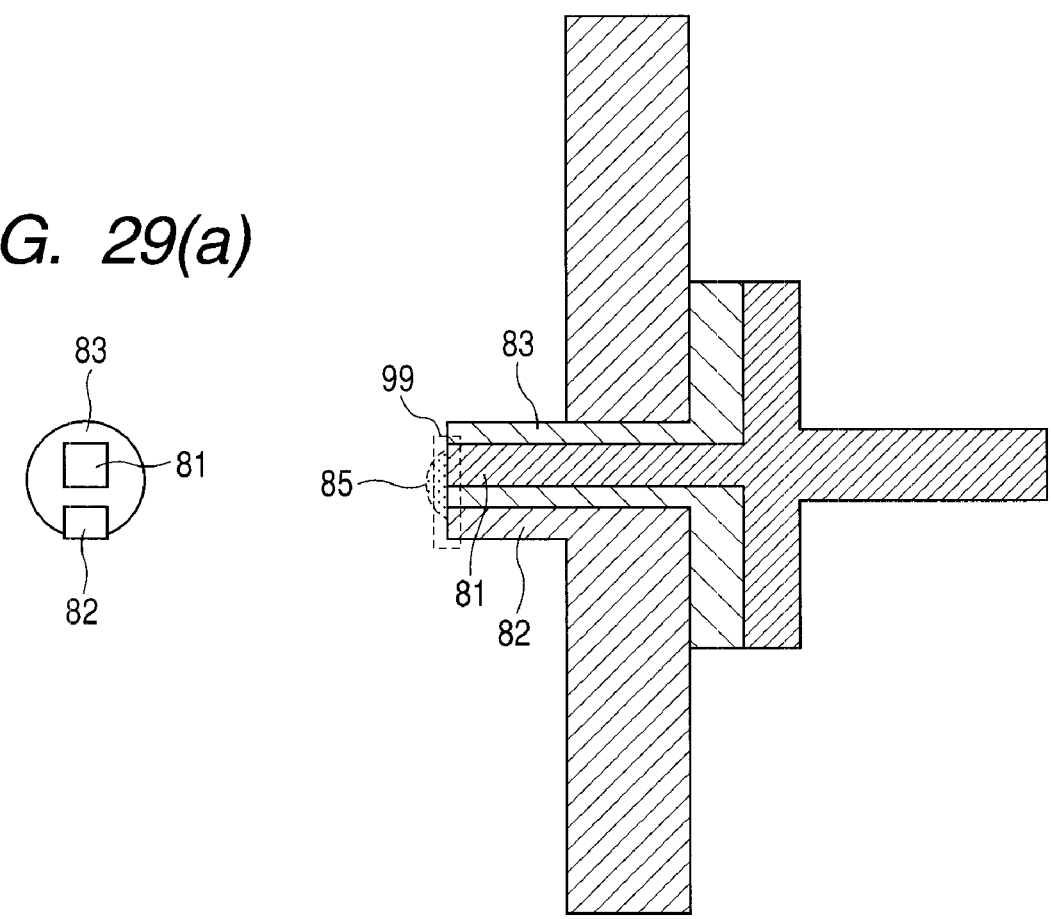

MANUFACTURING METHOD OF SEMICONDUCTOR INTEGRATED CIRCUIT DEVICE

CROSS-REFERENCE TO RELATED APPLICATION

The present application claims priority from Japanese patent application No. 2007-199135 filed on Jul. 31, 2007, the content of which is hereby incorporated by reference into this application.

BACKGROUND OF THE INVENTION

The present invention relates to a technique which is useful for the CVD technique in a manufacturing method of semiconductor integrated device (or semiconductor device).

In Japanese Unexamined Patent Publication No. 2002-033312 (Patent Document 1) or U.S. Pat. No. 6,592,817 (Patent Document 2), it is disclosed to detect the end point of cleaning by providing a T-shaped antenna on the way of an exhaust line and monitoring light emitted when exhaust is excited in remote plasma cleaning of a plasma CVD apparatus.

In Japanese Unexamined Patent Publication No. 08-193271 (Patent Document 3) or U.S. Pat. No. 5,830,310 (Patent Document 4), it is disclosed to detect the end point of cleaning by electric monitoring of a plasma of a CVD chamber in plasma cleaning of a plasma CVD apparatus.

In Japanese Unexamined Patent Publication No. 2002-270513 (Patent Document 5), it is disclosed to detect the end point of cleaning by analyzing gases of exhaust using a gas sensor in the cleaning of a plasma CVD apparatus.

In Japanese Unexamined Patent Publication No. 09-143742 (Patent Document 6) or U.S. Pat. No. 5,902,403 (Patent Document 7), it is disclosed to detect the end point of cleaning by monitoring the pressure of exhaust in the cleaning of a plasma CVD apparatus.

In Japanese Unexamined Patent Publication No. 2002-151475 (Patent Document 8), it is disclosed to detect the end point of cleaning by providing a plasma discharge mechanism of inductively coupled type at a branched portion on the way of an exhaust line, thereby exciting exhaust using the mechanism, and electrically monitoring the plasma in remote plasma cleaning of a plasma CVD apparatus.

In Japanese Unexamined Patent Publication No. 2005-033173 (Patent Document 9) or United States Unexamined Patent Publication No. 2004-0253828 (Patent Document 10), it is disclosed to detect the end point of cleaning by exciting a slight plasma in a CVD chamber and electrically monitoring the plasma in remote plasma cleaning of a plasma CVD apparatus.

In Japanese Unexamined Patent Publication No. 2006-210415 (Patent Document 11), various methods of measuring an impedance in a plasma apparatus are disclosed in detail.

In Japanese Unexamined Patent Publication No. 2002-057149 (Patent Document 12) or U.S. Pat. No. 7,201,174 (Patent Document 13), it is disclosed to detect the end point of cleaning by providing a local plasma excitation portion at a lower portion of a chamber and monitoring light emission in remote plasma cleaning of a plasma CVD apparatus.

SUMMARY OF THE INVENTION

In general, in a plasma CVD process in manufacturing processes of a semiconductor integrated circuit device or semiconductor device, in order to reduce foreign matter in quantity and ensure an excellent film formation property, a deposit film produced in a processing chamber at the time of film formation of the preceding wafer is removed by performing cleaning processing (in a state where no wafer to be processed is present in a processing chamber) of a processing chamber each time a unit of wafer (one in the case of a single wafer process) is processed. In the cleaning processing, in order to prevent electrodes and other precision parts from being damaged, normally, a cleaning gas, such as $NF_3$ etc., is plasma-excited outside the processing chamber and then generated fluoride radicals etc. are introduced in the processing chamber, and the deposited film that has stuck thereto is removed by gas phase reaction (generally, referred to as "remote plasma cleaning"). During the cleaning, because high-frequency power for film formation is not supplied in the processing chamber, it is considered to detect light emitted when the cleaning atmosphere is excited locally or electrically measure the locally excited plasma to detect the end point of the cleaning.

However, the present inventors have found that actual application of the above cleaning processing to mass production processes causes various problems. First, the local excitation of plasma itself is difficult because the condition is not suitable for plasma excitation different from that at the time of film formation. Secondary, even if plasma can be excited, a method that uses light has an unavoidable problem in a CVD process, such as the fogginess of a detection window, and therefore, it is not suitable for mass production processes.

An object of the present invention is to provide an end point detection technique in remote plasma cleaning suitable for mass production processes of a semiconductor integrated circuit device.

The above and further objects and novel features of the invention will more fully appear from the following detailed description in this specification and the accompanying drawings.

Preferred embodiments of the invention which will be disclosed herein are briefly outlined below.

In a manufacturing method of a semiconductor integrated circuit device (or semiconductor device) according to the present invention, in which the steps of depositing a desired film by exciting a reaction gas using plasma in a reaction chamber and performing remote plasma cleaning of the reaction chamber in a non-plasma excited atmosphere by introducing a cleaning gas excited in a remote plasma excitation chamber in the reaction chamber are repeated, a local plasma is generated in the reaction chamber or in a vacuum system for evacuating the reaction chamber by a plasma excitation system of capacitively coupled type, and the end point of the remote plasma cleaning is detected by monitoring the electrical characteristic of the plasma.

The effect brought about by typical embodiments of the invention is briefly described as follows.

Since the local plasma is utilized at the end point of the remote plasma cleaning, it is possible to accurately detect the end point without giving disturbance due to the measurement to the remote plasma cleaning itself.

BRIEF DESCRIPTION OF THE DRAWINGS

FIG. 2 is a schematic side sectional view of a local plasma excitation antenna portion for detecting the end point of cleaning of the plasma CVD apparatus used in a manufacturing method of the semiconductor integrated circuit device according to an embodiment of the present invention.

FIG. 3 is a circuit diagram of an electrical characteristic monitor circuit of a local plasma for detecting the end point of cleaning of the plasma CVD apparatus used in a manufacturing method of the semiconductor integrated circuit device according to an embodiment of the present invention.

FIG. 29 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.

DETAILED DESCRIPTION OF THE PREFERRED EMBODIMENTS

Outline of Preferred Embodiments

Figure 1:
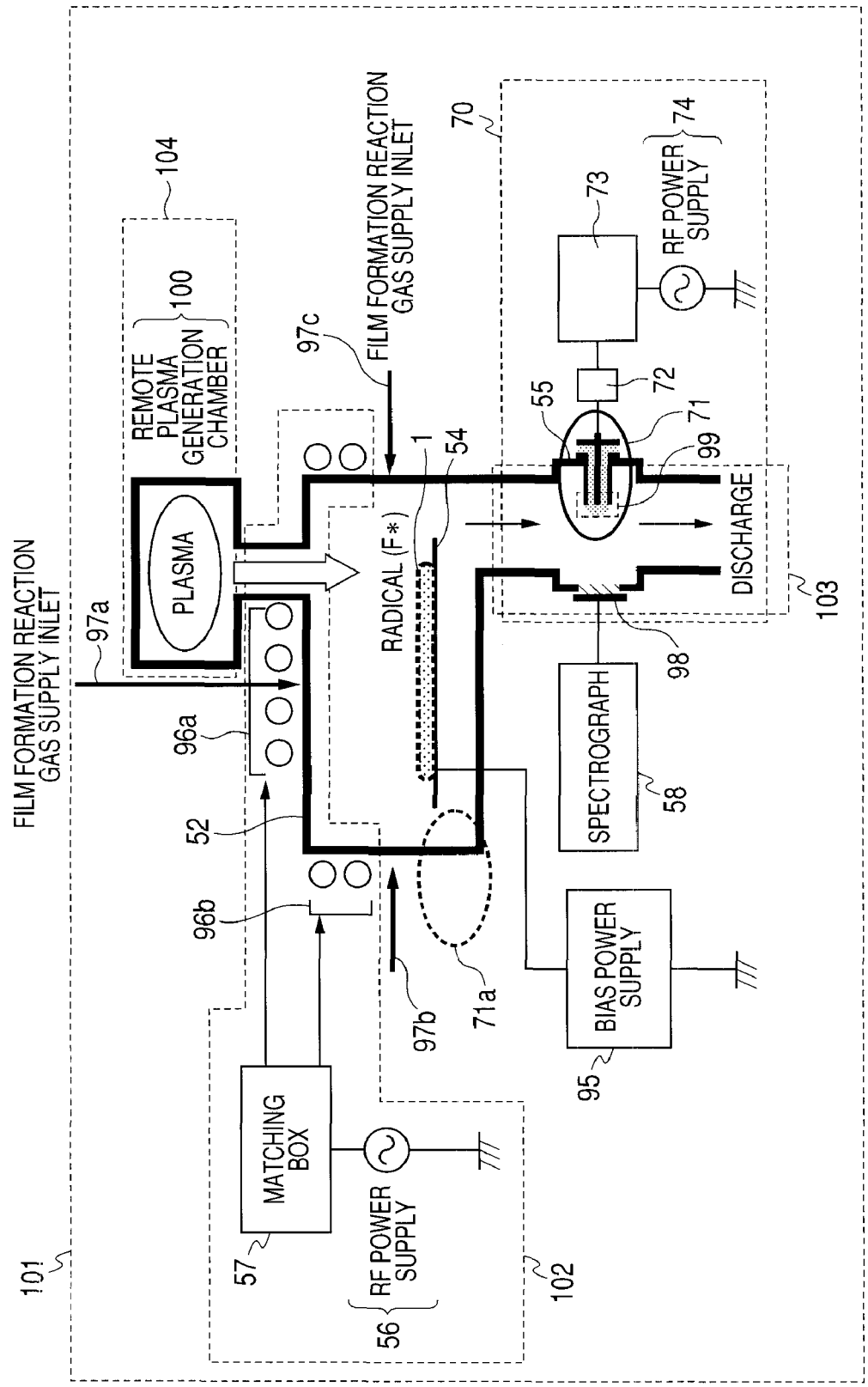
FIG. 1 is a schematic side sectional view of a plasma CVD apparatus used in a manufacturing method of a semiconductor integrated circuit device according to an embodiment of the present invention.

First, the outline of typical preferred embodiments of the present invention disclosed in the present application will be described below.

1. A manufacturing method of a semiconductor integrated circuit device, comprising the steps of:

(a) introducing a first wafer in a wafer processing chamber of a plasma CVD apparatus having a first plasma excitation system;

(b) performing a plasma CVD process on the first wafer introduced in the wafer processing chamber by plasma excitation using the first plasma excitation system;

(c) after the step (b), discharging the first wafer to the outside from the wafer processing chamber;

(d) after the step (c), performing remote plasma cleaning to the wafer processing chamber;

(e) introducing a second wafer in the wafer processing chamber to which the remote plasma cleaning has been performed; and (f) performing the plasma CVD process on the second wafer introduced in the wafer processing chamber by plasma excitation using the first plasma excitation system, wherein the step (d) includes the sub steps of:

(d1) plasma-exciting a cleaning gas using a second plasma excitation system in a remote plasma generation chamber provided outside the wafer processing chamber and transferring the excited cleaning gas into the wafer processing chamber;

(d2) generating a local plasma in the wafer processing chamber or in a vacuum pumping system for evacuating the wafer processing chamber by plasma-exciting the cleaning gas using a third plasma excitation system of capacitively coupled type;

(d3) detecting an end point of the remote plasma cleaning by monitoring electrical characteristic of the local plasma; and (d4) ending the remote plasma cleaning based on the result of the sub step (d3).

2. The manufacturing method of a semiconductor integrated circuit device according to Item 1, wherein the third plasma excitation system has an excitation antenna portion and a tip portion of the excitation antenna portion is inserted into the wafer processing chamber or the vacuum pumping system.

3. The manufacturing method of a semiconductor integrated circuit device according to Item 2, wherein the tip portion is inserted into the vacuum pumping system.

4. The manufacturing method of a semiconductor integrated circuit device according to Item 2 or 3, wherein the tip portion includes:

(i) an excitation electrode portion substantially exposed; and (ii) a ground electrode portion provided in close proximity to the excitation electrode portion in an electrically isolated state, and substantially exposed.

5. The manufacturing method of a semiconductor integrated circuit device according to any one of Items 2 to 4, wherein the excitation antenna portion is of monopole type.

6. The manufacturing method of a semiconductor integrated circuit device according to any one of Items 1 to 5, wherein the electrical characteristic is an impedance of the local plasma or a physical quantity corresponding thereto.

7. The manufacturing method of a semiconductor integrated circuit device according to Item 6, wherein the impedance or the physical quantity corresponding thereto is a plasma voltage, a self-bias voltage, or a plasma current of the local plasma.

8. The manufacturing method of a semiconductor integrated circuit device according to any one of Items 2 to 7, wherein the vacuum pumping system has a turbomolecular pump and the tip portion is inserted into the vacuum pumping system between the wafer processing chamber and the turbomolecular pump.

9. The manufacturing method of a semiconductor integrated circuit device according to any one of Items 4 to 8, wherein the area of the excitation electrode portion is less than 1% of the area of a single main surface of the first wafer.

10. The manufacturing method of a semiconductor integrated circuit device according to any one of Items 4 to 8, wherein the area of the excitation electrode portion is less than 0.5% of the area of a single main surface of the first wafer.

11. The manufacturing method of a semiconductor integrated circuit device according to any one of Items 4 to 8,
wherein the area of the excitation electrode portion is less than 0.3% of the area of a single main surface of the first wafer.

12. The manufacturing method of a semiconductor integrated circuit device according to any one of Items 4 to 8,
wherein the area of the excitation electrode portion is less than 0.1% of the area of a single main surface of the first wafer.

13. The manufacturing method of a semiconductor integrated circuit device according to any one of Items 4 to 12,
wherein the area of the excitation electrode portion is smaller than the area of the ground electrode portion.

14. The manufacturing method of a semiconductor integrated circuit device according to any one of Items 4 to 13,
wherein the front of the tip portion is substantially flat.

15. The manufacturing method of a semiconductor integrated circuit device according to any one of Items 4 to 14,
wherein the excitation electrode portion is surrounded by the ground electrode portion.

16. A manufacturing method of a semiconductor integrated circuit device, comprising the steps of:
(a) introducing a first wafer in a wafer processing chamber of a plasma CVD apparatus having a first plasma excitation system;
(b) performing a plasma CVD process on the first wafer introduced in the wafer processing chamber by plasma excitation using the first plasma excitation system;
(c) after the step (b), discharging the first wafer to the outside from the wafer processing chamber;
(d) after the step (c), performing remote plasma cleaning of the wafer processing chamber;
(e) introducing a second wafer in the wafer processing chamber to which the remote plasma cleaning has been performed; and
(f) performing the plasma CVD process on the second wafer introduced in the wafer processing chamber by plasma excitation using the first plasma excitation system,
wherein the step (d) includes the sub steps of:
(d1) plasma-exciting a cleaning gas using a second plasma excitation system in a remote plasma generation chamber provided outside the wafer processing chamber and transferring the excited cleaning gas into the wafer processing chamber;
(d2) generating a local plasma in a vacuum pumping system for evacuating the wafer processing chamber by plasma-exciting the cleaning gas using a third plasma excitation system of capacitively coupled type;
(d3) detecting an end point of the remote plasma cleaning by monitoring electrical characteristic of the local plasma; and
(d4) ending the remote plasma cleaning based on the result of the sub step (d3),
wherein the third plasma excitation system has an excitation antenna portion of monopole type and the tip portion of the excitation antenna portion is inserted into the wafer processing chamber or the vacuum pumping system.

17. The manufacturing method of a semiconductor integrated circuit device according to Item 16,
wherein the tip portion is inserted into the vacuum pumping system.

18. The manufacturing method of a semiconductor integrated circuit device according to Item 16 or 17,
wherein the electrical characteristic is an impedance of the local plasma or a physical quantity corresponding thereto.

19. The manufacturing method of a semiconductor integrated circuit device according to Item 18,
wherein the impedance or the physical quantity corresponding thereto is a plasma voltage, a self-bias voltage, or a plasma current of the local plasma.

20. The manufacturing method of a semiconductor integrated circuit device according to any one of Items 16 to 19,
wherein the vacuum pumping system has a turbomolecular pump and the tip portion is inserted into the vacuum pumping system between the wafer processing chamber and the turbomolecular pump.

21. The manufacturing method of a semiconductor integrated circuit device according to any one of Items 16 to 20,
wherein the tip portion includes:
(i) an excitation electrode portion substantially exposed; and
(ii) a ground electrode portion provided in close proximity to the excitation electrode portion in an electrically isolated state, and substantially exposed.

22. The manufacturing method of a semiconductor integrated circuit device according to any one of Items 16 to 21,
wherein the area of the excitation electrode portion is less than 1% of the area of a single main surface of the first wafer.

23. The manufacturing method of a semiconductor integrated circuit device according to Item 21,
wherein the area of the excitation electrode portion is less than 0.5% of the area of a single main surface of the first wafer.

24. The manufacturing method of a semiconductor integrated circuit device according to Item 21,
wherein the area of the excitation electrode portion is less than 0.3% of the area of a single main surface of the first wafer.

25. The manufacturing method of a semiconductor integrated circuit device according to Item 21,
wherein the area of the excitation electrode portion is less than 0.1% of the area of a single main surface of the first wafer.

26. The manufacturing method of a semiconductor integrated circuit device according to any one of Items 21 to 25,
wherein the area of the excitation electrode portion is smaller than the area of the ground electrode portion.

27. The manufacturing method of a semiconductor integrated circuit device according to any one of Items 16 to 26,
wherein the front of the tip portion is substantially flat.

28. The manufacturing method of a semiconductor integrated circuit device according to any one of Items 21 to 27,
wherein the excitation electrode portion is surrounded by the ground electrode portion.

Next, the outline of other preferred embodiments of the present invention disclosed in the present application will be described below.

29. A manufacturing method of a semiconductor integrated circuit device, comprising the steps of:
(a) introducing a first wafer in a wafer processing chamber of a plasma CVD apparatus having a first plasma excitation system;
(b) performing a plasma CVD process on the first wafer introduced in the wafer processing chamber by plasma excitation using the first plasma excitation system;
(c) after the step (b), discharging the first wafer to the outside from the wafer processing chamber;
(d) after the step (c), performing remote plasma cleaning of the wafer processing chamber;

(e) introducing a second wafer in the wafer processing chamber to which the remote plasma cleaning has been performed; and (f) performing the plasma CVD process on the second wafer introduced in the wafer processing chamber by plasma excitation using the first plasma excitation system:

wherein the step (d) includes the sub steps of:

(d1) plasma-exciting a cleaning gas using a second plasma excitation system in a remote plasma generation chamber provided outside the wafer processing chamber and transferring the excited cleaning gas into the wafer processing chamber;

(d2) generating a local plasma in the wafer processing chamber or in a vacuum pumping system for evacuating the wafer processing chamber by plasma-exciting the cleaning gas using a third plasma excitation system of capacitively coupled type;

(d3) detecting the end point of the remote plasma cleaning by monitoring the light emission of the local plasma; and (d4) ending the remote plasma cleaning based on the result of the sub step (d3);

wherein the third plasma excitation system has an excitation antenna portion and the tip portion of the excitation antenna portion is inserted into the wafer processing chamber or the vacuum pumping system, the third plasma excitation system including:

(i) an excitation electrode portion substantially exposed; and (ii) a ground electrode portion provided in close proximity to the excitation electrode portion in an electrically separate state, and substantially exposed; and, wherein the area of the excitation electrode portion is less than 1% of the area of the single main surface of the first wafer.

30. The manufacturing method of a semiconductor integrated circuit device according to Item 29, wherein the area of the excitation electrode portion is less than 0.5% of the area of a single main surface of the first wafer.

31. The manufacturing method of a semiconductor integrated circuit device according to Item 29, wherein the area of the excitation electrode portion is less than 0.3% of the area of a single main surface of the first wafer.

32. The manufacturing method of a semiconductor integrated circuit device according to Item 29, wherein the area of the excitation electrode portion is less than 0.1% of the area of a single main surface of the first wafer.

33. The manufacturing method of a semiconductor integrated circuit device according to any one of Items 29 to 32, wherein the tip portion is inserted into the vacuum pumping system.

34. The manufacturing method of a semiconductor integrated circuit device according to any one of Items 29 to 33, wherein the excitation antenna portion is of monopole type.

35. The manufacturing method of a semiconductor integrated circuit device according to any one of Items 29 to 34, wherein the electrical characteristic is an impedance of the local plasma or a physical quantity corresponding thereto.

36. The manufacturing method of a semiconductor integrated circuit device according to Item 35, wherein the impedance or the physical quantity corresponding thereto is a plasma voltage, a self-bias voltage, or a plasma current of the local plasma.

37. The manufacturing method of a semiconductor integrated circuit device according to any one of Items 29 to 36, wherein the vacuum pumping system has a turbomolecular pump and the tip portion is inserted into the vacuum pumping system between the wafer processing chamber and the turbomolecular pump.

38. The manufacturing method of a semiconductor integrated circuit device according to any one of Items 29 to 37, wherein the area of the excitation electrode portion is smaller than the area of the ground electrode portion.

39. The manufacturing method of a semiconductor integrated circuit device according to any one of Items 29 to 38, wherein the front of the tip portion is substantially flat.

40. The manufacturing method of a semiconductor integrated circuit device according to any one of Items 29 to 39, wherein the excitation electrode portion is surrounded by the ground electrode portion.

41. A manufacturing method of a semiconductor integrated circuit device, comprising the steps of:

(a) introducing a first wafer in a wafer processing chamber of a thermal CVD apparatus;

(b) performing a thermal CVD process on the first wafer introduced in the wafer processing chamber;

(c) after the step (b), discharging the first wafer to the outside from the wafer processing chamber;

(d) after the step (c), performing remote plasma cleaning of the wafer processing chamber;

(e) introducing a second wafer in the wafer processing chamber to which the remote plasma cleaning has been performed; and (f) performing the thermal CVD process on the second wafer introduced in the wafer processing chamber, wherein the step (d) includes the sub steps of:

(d1) plasma-exciting a cleaning gas using a first plasma excitation system in a remote plasma generation chamber provided outside the wafer processing chamber and transferring the excited cleaning gas into the wafer processing chamber;

(d2) generating a local plasma in the wafer processing chamber or in a vacuum pumping system for evacuating the wafer processing chamber by plasma-exciting the cleaning gas using a second plasma excitation system of capacitively coupled type;

(d3) detecting an end point of the remote plasma cleaning by monitoring electrical characteristic of the local plasma; and (d4) ending the remote plasma cleaning based on the result of the sub step (d3).

42. The manufacturing method of a semiconductor integrated circuit device according to Item 41, wherein the second plasma excitation system has an excitation antenna portion and the tip portion of the excitation antenna portion is inserted into the wafer processing chamber or the vacuum pumping system.

43. The manufacturing method of a semiconductor integrated circuit device according to Item 42, wherein the tip portion is inserted into the vacuum pumping system.

44. The manufacturing method of a semiconductor integrated circuit device according to Item 42 or 43, wherein the tip portion includes:

(i) an excitation electrode portion substantially exposed; and (ii) a ground electrode portion provided in close proximity to the excitation electrode portion in an electrically separated state, and substantially exposed.

45. The manufacturing method of a semiconductor integrated circuit device according to Item 44, wherein the excitation antenna portion is of monopole type.

46. The manufacturing method of a semiconductor integrated circuit device according to any one of Items 41 to 45, wherein the electrical characteristic is an impedance of the local plasma or a physical quantity corresponding thereto.

47. The manufacturing method of a semiconductor integrated circuit device according to Item 46, wherein the impedance or the physical quantity corresponding thereto is a plasma voltage, a self-bias voltage, or a plasma current of the local plasma.

48. The manufacturing method of a semiconductor integrated circuit device according to any one of Items 42 to 47, wherein the tip portion is inserted into the vacuum pumping system between the wafer processing chamber and a pump nearest to the wafer processing chamber among one or two or more of the vacuum pumps in the vacuum pumping system.

49. The manufacturing method of a semiconductor integrated circuit device according to any one of Items 44 to 48, wherein the area of the excitation electrode portion is less than 1% of the area of a single main surface of the first wafer.

50. The manufacturing method of a semiconductor integrated circuit device according to any one of Items 44 to 48, wherein the area of the excitation electrode portion is less than 0.5% of the area of a single main surface of the first wafer.

51. The manufacturing method of a semiconductor integrated circuit device according to any one of Items 44 to 48, wherein the area of the excitation electrode portion is less than 0.3% of the area of a single main surface of the first wafer.

52. The manufacturing method of a semiconductor integrated circuit device according to any one of Items 44 to 48, wherein the area of the excitation electrode portion is less than 0.1% of the area of a single main surface of the first wafer.

53. The manufacturing method of a semiconductor integrated circuit device according to any one of Items 44 to 52, wherein the area of the excitation electrode portion is smaller than the area of the ground electrode portion.

54. The manufacturing method of a semiconductor integrated circuit device according to any one of Items 44 to 53, wherein the front of the tip portion is substantially flat.

55. The manufacturing method of a semiconductor integrated circuit device according to any one of Items 44 to 54, wherein the excitation electrode portion is surrounded by the ground electrode portion.

56. A manufacturing method of a semiconductor integrated circuit device, comprising the steps of:

(a) introducing a first wafer in a wafer processing chamber of a CVD apparatus;

(b) performing a CVD process on the first wafer introduced in the wafer processing chamber;

(c) after the step (b), discharging the first wafer to the outside from the wafer processing chamber;

(d) after the step (c), performing gas phase cleaning of the wafer processing chamber;

(e) introducing a second wafer in the wafer processing chamber to which the gas phase cleaning has been performed; and (f) performing the CVD process on the second wafer introduced in the wafer processing chamber, wherein the step (d) includes the sub steps of:

(d1) introducing a cleaning gas in the wafer processing chamber;

(d2) generating a local plasma in the wafer processing chamber or in a vacuum pumping system for evacuating the wafer processing chamber by plasma-exciting the cleaning gas using a plasma excitation system of capacitively coupled type;

(d3) detecting the end point of the gas phase cleaning by monitoring the electrical characteristic of the local plasma; and (d4) ending the gas phase cleaning based on the result of the sub step (d3).

57. The manufacturing method of a semiconductor integrated circuit device according to Item 56, wherein the plasma excitation system has an excitation antenna portion and the tip portion of the excitation antenna portion is inserted into the wafer processing chamber or the vacuum pumping system.

58. The manufacturing method of a semiconductor integrated circuit device according to Item 57, wherein the tip portion is inserted into the vacuum pumping system.

59. The manufacturing method of a semiconductor integrated circuit device according to Item 57 or 58, wherein the tip portion includes:

(i) an excitation electrode portion substantially exposed; and (ii) a ground electrode portion provided in close proximity to the excitation electrode portion in an electrically separated state, and substantially exposed.

60. The manufacturing method of a semiconductor integrated circuit device according to Item 59, wherein the excitation antenna portion is of monopole type.

61. The manufacturing method of a semiconductor integrated circuit device according to any one of Items 56 to 60, wherein the electrical characteristic is an impedance of the local plasma or a physical quantity corresponding thereto.

62. The manufacturing method of a semiconductor integrated circuit device according to Item 61, wherein the impedance or the physical quantity corresponding thereto is a plasma voltage, a self-bias voltage, or a plasma current of the local plasma.

63. The manufacturing method of a semiconductor integrated circuit device according to any one of Items 57 to 62, wherein the tip portion is inserted into the vacuum pumping system between the wafer processing chamber and a pump nearest to the wafer processing chamber among one or two or more of the vacuum pumps in the vacuum pumping system.

64. The manufacturing method of a semiconductor integrated circuit device according to any one of Items 59 to 63, wherein the area of the excitation electrode portion is less than 1% of the area of a single main surface of the first wafer.

65. The manufacturing method of a semiconductor integrated circuit device according to any one of Items 59 to 63, wherein the area of the excitation electrode portion is less than 0.5% of the area of a single main surface of the first wafer.

66. The manufacturing method of a semiconductor integrated circuit device according to any one of Items 59 to 63, wherein the area of the excitation electrode portion is less than 0.3% of the area of a single main surface of the first wafer.

67. The manufacturing method of a semiconductor integrated circuit device according to any one of Items 59 to 63, wherein the area of the excitation electrode portion is less than 0.1% of the area of a single main surface of the first wafer.

68. The manufacturing method of a semiconductor integrated circuit device according to any one of Items 59 to 67, wherein the area of the excitation electrode portion is smaller than the area of the ground electrode portion.

69. The manufacturing method of a semiconductor integrated circuit device according to any one of Items 59 to 68, wherein the front of the tip portion is substantially flat.

70. The manufacturing method of a semiconductor integrated circuit device according to any one of Items 59 to 69, wherein the excitation electrode portion is surrounded by the ground electrode portion.

71. A manufacturing method of a semiconductor integrated circuit device, comprising the steps of:
    (a) introducing a first wafer in a wafer processing chamber of a plasma CVD apparatus having a first plasma excitation system;
    (b) performing a plasma CVD process on the first wafer introduced in the wafer processing chamber by plasma excitation using the first plasma excitation system;
    (c) after the step (b), discharging the first wafer to the outside from the wafer processing chamber;
    (d) after the step (c), performing remote plasma cleaning to the wafer processing chamber;
    (e) introducing a second wafer in the wafer processing chamber to which the remote plasma cleaning has been performed; and
    (f) performing the plasma CVD process on the second wafer introduced in the wafer processing chamber by plasma excitation using the first plasma excitation system,
    wherein the step (d) includes the sub steps of:
    (d1) plasma-exciting a cleaning gas using a second plasma excitation system in a remote plasma generation chamber provided outside the wafer processing chamber and transferring the excited cleaning gas into the wafer processing chamber;
    (d2) generating a local plasma in a vacuum pumping system for evacuating the wafer processing chamber by plasma-exciting the cleaning gas using a third plasma excitation system of capacitively coupled type;
    (d3) detecting the end point of the remote plasma cleaning by monitoring the electrical characteristic of the local plasma; and
    (d4) ending the remote plasma cleaning based on the result of the sub step (d3);
    wherein the third plasma excitation system has an excitation antenna portion and the tip portion of the excitation antenna portion is inserted into the vacuum pumping system, the third plasma excitation system including:
    (i) an excitation electrode portion substantially exposed; and
    (ii) a ground electrode portion provided in close proximity to the excitation electrode portion in an electrically separate state, and substantially exposed; and,
    wherein an excitation electrode dimension ratio of the excitation electrode portion is 50% or less.

72. The manufacturing method of a semiconductor integrated circuit device according to Item 71, wherein the excitation electrode dimension ratio is 30% or less.

73. The manufacturing method of a semiconductor integrated circuit device according to Item 71, wherein the excitation electrode dimension ratio is 20% or less.

74. The manufacturing method of a semiconductor integrated circuit device according to any one of Items 71 to 73, wherein the excitation antenna portion is of monopole type.

75. The manufacturing method of a semiconductor integrated circuit device according to any one of Items 71 to 74, wherein the electrical characteristic is an impedance of the local plasma or a physical quantity corresponding thereto.

76. The manufacturing method of a semiconductor integrated circuit device according to Item 75, wherein the impedance or the physical quantity corresponding thereto is a plasma voltage, a self-bias voltage, or a plasma current of the local plasma.

77. The manufacturing method of a semiconductor integrated circuit device according to any one of Items 71 to 76, wherein the tip portion of the excitation antenna portion is located at the center portion or in the vicinity of the exhaust pipe.

78. The manufacturing method of a semiconductor integrated circuit device according to any one of Items 71 to 77, wherein the excitation antenna portion is of coaxial type.

79. The manufacturing method of a semiconductor integrated circuit device according to any one of Items 71 to 78, wherein the excitation antenna portion excites a plasma by silent discharge.

80. The manufacturing method of a semiconductor integrated circuit device according to any one of Items 71 to 79, wherein the step (d) further includes the sub step of:
    (d5) before the sub steps (d1) to (d3), cleaning the tip portion by plasma excitation using the third plasma excitation system while flowing an inert gas around the tip portion of the excitation antenna portion.

81. A manufacturing method of a semiconductor integrated circuit device, comprising the steps of:
    (a) introducing a first wafer in a wafer processing chamber of a plasma CVD apparatus having a first plasma excitation system;
    (b) performing a plasma CVD process on the first wafer introduced in the wafer processing chamber by plasma excitation using the first plasma excitation system;
    (c) after the step (b), discharging the first wafer to the outside from the wafer processing chamber;
    (d) after the step (c), performing remote plasma cleaning to the wafer processing chamber;
    (e) introducing a second wafer in the wafer processing chamber to which the remote plasma cleaning has been performed; and
    (f) performing the plasma CVD process on the second wafer introduced in the wafer processing chamber by plasma excitation using the first plasma excitation system,
    wherein the step (d) includes the sub steps of:
    (d1) plasma-exciting a cleaning gas using a second plasma excitation system in a remote plasma generation chamber provided outside the wafer processing chamber and transferring the excited cleaning gas into the wafer processing chamber;
    (d2) generating a local plasma in the wafer processing chamber or in a vacuum pumping system for evacuating the wafer processing chamber by plasma-exciting the cleaning gas using a third plasma excitation system of capacitively coupled type;
    (d3) detecting the end point of the remote plasma cleaning by monitoring the local plasma; and
    (d4) ending the remote plasma cleaning based on the result of the sub step (d3);
    wherein the third plasma excitation system has an excitation antenna portion and the tip portion of the excitation antenna portion is inserted into the vacuum pumping system, the third plasma excitation system including:

(i) an excitation electrode portion substantially exposed; and (ii) a ground electrode portion provided in close proximity to the excitation electrode portion in an electrically separate state, and substantially exposed; and, wherein an excitation electrode dimension ratio of the excitation electrode portion is 50% or less.

82. The manufacturing method of a semiconductor integrated circuit device according to Item 81, wherein the excitation electrode dimension ratio is 30% or less.

83. The manufacturing method of a semiconductor integrated circuit device according to Item 81, wherein the excitation electrode dimension ratio is 20% or less.

84. The manufacturing method of a semiconductor integrated circuit device according to any one of Items 81 to 83, wherein the excitation antenna portion is of monopole type.

85. The manufacturing method of a semiconductor integrated circuit device according to any one of Items 81 to 84, wherein the monitoring of the local plasma is performed by monitoring an impedance of the local plasma or a physical quantity corresponding thereto.

86. The manufacturing method of a semiconductor integrated circuit device according to Item 85, wherein the impedance or the physical quantity corresponding thereto is a plasma voltage, a self-bias voltage, or a plasma current of the local plasma.

87. The manufacturing method of a semiconductor integrated circuit device according to any one of Items 81 to 86, wherein the tip portion of the excitation antenna portion is located at the center portion or in the vicinity of the exhaust pipe.

88. The manufacturing method of a semiconductor integrated circuit device according to any one of Items 81 to 87, wherein the excitation antenna portion is of coaxial type.

89. The manufacturing method of a semiconductor integrated circuit device according to any one of Items 81 to 88, wherein the excitation antenna portion excites a plasma by silent discharge.

90. The manufacturing method of a semiconductor integrated circuit device according to any one of Items 81 to 89, wherein the step (d) further includes the sub step of:

(d5) before the sub steps (d1) to (d3), cleaning the tip portion by plasma excitation using the third plasma excitation system while flowing an inert gas around the tip portion of the excitation antenna portion.

91. A manufacturing method of a semiconductor integrated circuit device, comprising the steps of:

(a) introducing a first wafer in a wafer processing chamber of a CVD apparatus;

(b) performing a CVD process on the first wafer introduced in the wafer processing chamber;

(c) after the step (b), discharging the first wafer to the outside from the wafer processing chamber;

(d) after the step (c), performing gas phase cleaning of the wafer processing chamber;

(e) introducing a second wafer in the wafer processing chamber to which the gas phase cleaning has been performed; and (f) performing the CVD process on the second wafer introduced in the wafer processing chamber, wherein the step (d) includes the sub steps of:

(d1) introducing a cleaning gas in the wafer processing chamber;

(d2) generating a local plasma in the wafer processing chamber or in a vacuum pumping system for evacuating the wafer processing chamber by plasma-exciting the cleaning gas using a plasma excitation system of capacitively coupled type;

(d3) detecting the end point of the gas phase cleaning by monitoring the electrical characteristic of the local plasma; and (d4) ending the gas phase cleaning based on the result of the sub step (d3), wherein the plasma excitation system has an excitation antenna portion and the tip portion of the excitation antenna portion is inserted into the wafer processing chamber or the vacuum pumping system, the plasma excitation system including:

(i) an excitation electrode portion substantially exposed; and (ii) a ground electrode portion provided in close proximity to the excitation electrode portion in an electrically separate state, and substantially exposed; and, wherein an excitation electrode dimension ratio of the excitation electrode portion is 50% or less.

92. The manufacturing method of a semiconductor integrated circuit device according to Item 91, wherein the excitation electrode dimension ratio is 30% or less.

93. The manufacturing method of a semiconductor integrated circuit device according to Item 91, wherein the excitation electrode dimension ratio is 20% or less.

94. The manufacturing method of a semiconductor integrated circuit device according to any one of Items 91 to 93, wherein the excitation antenna portion is of monopole type.

95. The manufacturing method of a semiconductor integrated circuit device according to any one of Items 91 to 94, wherein the electrical characteristic is an impedance of the local plasma or a physical quantity corresponding thereto.

96. The manufacturing method of a semiconductor integrated circuit device according to Item 95, wherein the impedance or the physical quantity corresponding thereto is a plasma voltage, a self-bias voltage, or a plasma current of the local plasma.

97. The manufacturing method of a semiconductor integrated circuit device according to any one of Items 91 to 96, wherein the tip portion of the excitation antenna portion is located at the center portion or in the vicinity of the exhaust pipe.

98. The manufacturing method of a semiconductor integrated circuit device according to any one of Items 91 to 97, wherein the excitation antenna portion is of coaxial type.

99. The manufacturing method of a semiconductor integrated circuit device according to any one of Items 91 to 98, wherein the excitation antenna portion excites a plasma by silent discharge.

100. The manufacturing method of a semiconductor integrated circuit device according to any one of Items 91 to 99, wherein the step (d) further includes the sub step of:

(d5) before the sub steps (d1) to (d3), cleaning the tip portion by plasma excitation using the third plasma excitation system while flowing an inert gas around the tip portion of the excitation antenna portion.

[Explanation of Description Forms, Basic Terms, and their Usage in the Present Application]

1. In the present application, there may be a case where the description of embodiments is given by dividing the description into a plurality of sections when necessary from the standpoint of convenience, however, except when explicitly specified otherwise in particular, these sections are not independent of one another but they are in a relationship in which each portion or one of portions in a single example is part of details of the others or a modification etc. of part of the others or all of them. As a general rule, the duplicated description of like portions is omitted. In addition, each component in the embodiments is not indispensable except when explicitly specified otherwise in particular or when the number of components is limited theoretically to a certain number or obviously otherwise from the context.

2. Similarly, in the description of embodiments, the wording "X comprising A" or the like for materials, compositions, etc., does not exclude a case where X comprises components other than A as a main component except when explicitly specified otherwise in particular or obviously otherwise from the context. For example, it means "X comprising A as a main component" etc. It is obvious that, for example, "silicon member" etc. does not limit the member to those made of pure silicon but includes members including SiGe alloy, multi-element alloy having silicon as a main component, other additives, etc. Similarly, it is obvious that "silicon oxide film" includes not only comparatively pure undoped silicon oxide (undoped silicon oxide or non-doped silicate glass) but also fluorosilicate glass (FSG), TEOS-based silicon oxide, silicon oxicarbide (SiOC), carbon-doped silicon oxide, organosilicate glass (OSG), phosphorus silicate glass (PSG), a thermal oxide film such as borophosphosilicate glass (BPSG), a CVD oxide film, spin ON glass (SOG), silicon oxide for application such as nano-clustering silica (NSC), a silica-based low-k insulating film (porous-based insulating film), which is a similar member into which vacancies have been introduced, and a film etc. compounded with other silicon-based insulating film having these as a main component.

3. Similarly, although preferred examples are given as to shapes, positions, attributes, etc., it is obvious that those shapes, positions, attributes, etc., are not strictly limited except when explicitly specified otherwise in particular or when obviously otherwise from the context.

4. Further, when a specific value or number is referred to, a value that exceeds the specific value or a value less than the specific value may be included except when explicitly specified otherwise in particular or the value is limited theoretically to the specific value or obviously otherwise from the context.

5. In general, a "wafer" means a single crystal silicon wafer over which a semiconductor integrated circuit device (including semiconductor device, electronic device) is formed, however, it is obvious that an epitaxial wafer, a compound wafer of an insulating substrate and a semiconductor layer etc. are also included. 6. A "vacuum pump" includes a dry pump, a mechanical booster, a turbomolecular pump, a cryopump, etc. 7. An "exhaust system" is not limited to only a main exhaust path in a vacuum pumping system except when explicitly specified otherwise in particular or obviously otherwise, but a bypass, a branch isolated or branched therefrom, etc., are also included.

Details of Preferred Embodiments

Preferred embodiments will be described in greater detail. In each figure, the same or similar portions are denoted by the same or similar symbols or reference numerals and its description is not repeated as a general rule.

Preferred Embodiments

1. Description of Devices and the like used in the Present Embodiment (mainly from FIG. 1 to FIG. 5)

Referring to FIG. 1, a configuration of an inductively coupled plasma CVD apparatus 101 (classified as so-called high density plasma furnace) having a remote plasma cleaning mechanism 100 used in the present embodiment is described. It is obvious that the present invention can be applied not only to that which uses a thermal CVD apparatus but also to that which performs cleaning without use of plasma excitation.

First, the operation and function of each portion at the time of film formation are described with reference to FIG. 1. A wafer 1 to be processed (first wafer), such as a 300 f single crystal silicon wafer, is placed over a lower electrode 54 (electrostatic chuck, and also wafer susceptor) in a film formation processing chamber 52. The lower electrode 54 is coupled to a bias power supply 95. A reaction gas (normally, including other additional gases) at a predetermined degree of vacuum is supplied through a film forming reaction gas supply inlet 97a on the top side and film forming reaction gas supply inlets 97b, 97c on the lateral side, and when RF power is supplied to excitation coils 96a, 96b from an RF power supply 56 of a film forming plasma excitation system 102 through a matching box 57, plasma is generated by inductive coupling and thereby film forming reaction proceeds. When film formation is completed, the processed wafer 1 is taken out of the furnace. If the next wafer 1 (second wafer) is introduced for processing without anything done, it is difficult in general to form a film of the same quality of the previous wafer. That is, the same condition under which the previous wafer is processed is required in the furnace, namely, it is necessary to restore the state where there are films stuck to the inner surface of the furnace to the same state (initial state) where the previous wafer is processed. This is called cleaning. However, in an example shown in FIG. 6 below, it seems that the process is more stable in a state where some amount of initial deposit is stuck initially before the first film forming processing probably because of a comparatively high degree of vacuum, and the above description may apply more accurately to the second and later wafers.

Before cleaning, the previous film formation atmosphere is evacuated by a wafer processing chamber vacuum pumping system 103 (in general, a dry pump or turbomolecular pump is provided as a main pump in the vicinity of the processing chamber 52). After that, in the plasma generation chamber 100 of a remote plasma excitation system 104, the radical of a cleaning gas (for example, a gas including inorganic gas containing fluorine, such as $NF_3$, or an organic gas containing fluorine) is generated by plasma excitation and it is transferred to the wafer processing chamber 52 (wafer is not accommodated). Due to this, cleaning reaction proceeds and the wafer processing chamber 52 returns to its initial state. The cleaning time required to exactly return the wafer processing chamber 52 to its initial state varies from time to time. Consequently, it is necessary to end the cleaning by detecting each time the point of time when the products stuck to the inner surface of the wafer processing chamber are almost removed as an end point (this is not always necessary, as will be described later). This is the detection of cleaning end point.

Next, a detecting method of cleaning end point is described. A plasma excitation system 70 for detecting end point (end point detecting local plasma excitation & monitor system) is connected to the vacuum pumping system 103 (it may be provided in the film forming chamber 52). That is, a tip portion 99 of an excitation antenna portion 71 is inserted into an exhaust flow path wall 55 (made of metal and grounded) of the vacuum pumping system 103 and to the excitation antenna portion 71, the RF power is supplied from an RF power supply 74 via a matching box 73. Due to this, local plasma is generated at the front portion of the tip portion 99. The electrical characteristic of the plasma is observed by a high-voltage monitor 72 (plasma impedance monitor). In addition, because of the local plasma, it is also possible to provide the excitation antenna portion 71 in the processing chamber 52 as an excitation antenna portion 71a in the processing chamber.

It is also possible to detect the cleaning end point by monitoring light emission of the local plasma having transmitted an observation window 98 using a spectrograph 58 in addition to the monitoring by a plasma voltage or the like. This can be used to correct the detection of end point by monitoring the plasma voltage or the like. In general, the sensitivity of detecting end point is higher in the case of light emission, however, for mass production, there is a problem of window fogginess etc.

When the cleaning is completed, the next wafer 1 (second wafer) is introduced in the wafer processing chamber 52 and the film forming processing equivalent to that for the previous wafer is performed. In this manner, until all of the wafers in units of lots are processed, the film formation and cleaning are repeated, that is, the film forming/cleaning circulation process is performed. When the processing of the lot is completed, the pre-processing of the lot is performed to adjust the state of the device (refer to FIG. 6 or FIG. 15).

Next, a detailed structure of the excitation antenna portion 71 (capacitively coupled type) is described based on FIG. 2. FIG. 2(a) is a front view when viewed from the interior of the vacuum pumping system 103 (exhaust flow path), and FIG. 2(b) is an A-A cross sectional view. An excitation electrode portion 81 (constituting a drive electrode of a monopole antenna) is surrounded by a ground electrode portion 82 via an interelectrode insulator 83 and the ground electrode portion 82 is coupled to the exhaust flow path wall 55. Each portion is sealed at the flange portion via O rings 86a, 86b, and 86c. The drive power of the excitation electrode portion 81 is supplied from a high-frequency coaxial connector 112 retained at a metal cap 111 (although short wave band of 13.56 MHz or middle wave band of 400 KHz are suitable from the standpoint of ignitability and discharge stability, there is an advantage that the circuits for AC and direct current power are simple). When power is supplied here, local plasma 85 is generated in the vicinity of the tip portion 99 of the excitation antenna portion 71. The diameters of the concentric circles of the tip portion 99, that is, the diameter of each concentric circle of the excitation electrode 81, the interelectrode insulator 83, and the ground electrode portion 82 is, for example, 4 mm, 8 mm, and 32 mm in this order. Consequently, the exposed area (Sc) of the front portion of the excitation electrode is about 12.6 mm² and the exposed area (Sg) of the front portion of the tip portion 99 of the ground electrode portion is about 754 mm², and there is a relationship of Sc/Sg=1.7% (that is, Sc is smaller than Sg). That is, Sc is sufficiently smaller than Sg. This is compared with the area of the unit main surface of an unprocessed wafer. The area ($S_2$) of the main surface of a 200 f wafer is about 3,140 mm². The area ($S_3$) of the main surface of a 300 f wafer is about 70,700 mm². Sc/$S_2$ is about 0.4% and SC/$S_3$ is about 0.02%. The smaller Sc is, the more local the plasma is, and as a result, the influence on the furnace body is small and the excitation power can be reduced. Consequently, if these are assumed to be the areas against wafer (Sc/$S_2$, Sc/$S_3$), it is desirable that the area against wafer be less than 1% in order to make the plasma local. Further, in order to make the plasma sufficiently local, it is desirable that the area against wafer be less than 0.5%. In addition, in consideration of the suppression of excitation power or the DC drive, less than 0.3% is desirable. Furthermore, in order to sufficiently suppress the excitation power, less than 0.1% is desirable. As described above, because of the capacitively coupled type, it is possible to excite a plasma locally with a smaller power compared to the inductively coupled type. This is because the coupling is comparatively direct with a region to be excited or via a thin dielectric (physically, via a capacitor formed between the plasma and the excitation electrode) different from the inductively coupled type in which the region to be excited is surrounded by a comparatively thick insulator. With a fine excitation electrode, it is possible to limit the local region of the plasma to be excited to a very narrow region. Since the plasma is centralized in a fine region, there is an advantage that no deposit is deposited on a portion where the local plasma is generated. There is also another advantage that not only the evacuation operation is not impeded but also the attack of the reactive gas is unlikely to receive because the tip portion is flat, forming substantially a flat plane with the peripheral pipe wall.

The outline of a configuration of the local plasma excitation & monitor system 70 for end point detection is described based on FIG. 3. Such a plasma impedance monitor is commercially available as the high-voltage probe 72 or the like and when used, in general, it is connected to a measurement node 124 between the excitation antenna portion 71 (discharge probe) and the matching box 73 or the like. It may also be possible to install a current transformer for a current probe at the measurement node 124 and measure Ipp (plasma current) using the current probe 121. In this case, because the coupling at the measurement node 124 is indirect, that is, of electromagnetic inductively coupled type, there is an advantage that the influence of measurement on the local plasma is small. A signal obtained from these probe circuits is processed in a signal processing portion 123 and output to a CVD apparatus control system as Vpp (plasma voltage), Ipp (plasma current), Vdc (self bias voltage), or an analog or digital signal corresponding thereto. When it is assumed that the maximum value and the minimum value of the voltage in a single cycle of the measurement node 124 are Vmax and Vmin, there are relationships among the electric parameters as to each plasma that Vpp=Vmax−Vmin (relationship 1), Vdc=(Vpp/2)−Vmin, or the like. Consequently, it may also be possible to change the parameter to a desired one in a signal processing portion 122 at an appropriate time based on one of them. The change of the self-bias voltage near the end point is clearer than that of the plasma voltage and the plasma current (refer to FIG. 4). This is because the condition of the gas in the local plasma is reflected more directly.

Figure 4:
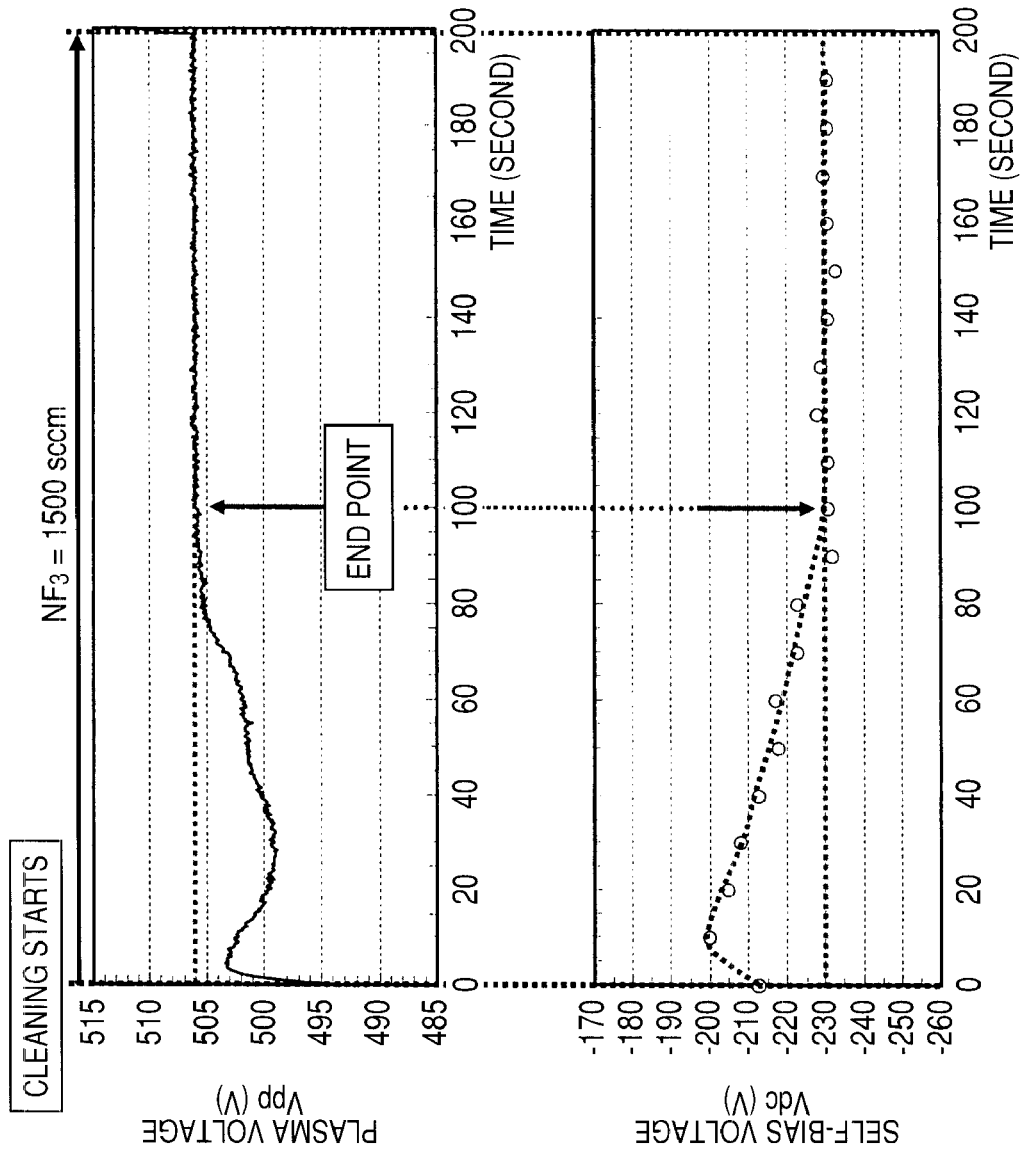
FIG. 4 is a measurement diagram showing the principle of a cleaning end point detecting method in a plasma CVD process used in a manufacturing method of the semiconductor integrated circuit device according to an embodiment of the present invention.

The principle of cleaning end point detection is described based on FIG. 4. From the figure, it can be seen that both the voltages converge to a fixed value near their end points. This can also be confirmed by the change with time in the strength distribution of fluorine and nitrogen (the strength of light emission rapidly converges to a fixed value). Here, an example is described specifically, in which the self-bias voltage or the plasma voltage (including plasma current) is measured, however, basically, it is possible to determine the end point by a physical quantity changing corresponding to the plasma impedance, that is, any of the impedance itself, voltages (Vdc, Vpp), current, etc. It is obvious that the end point can be detected by light emission as the need arises.

Figure 5:
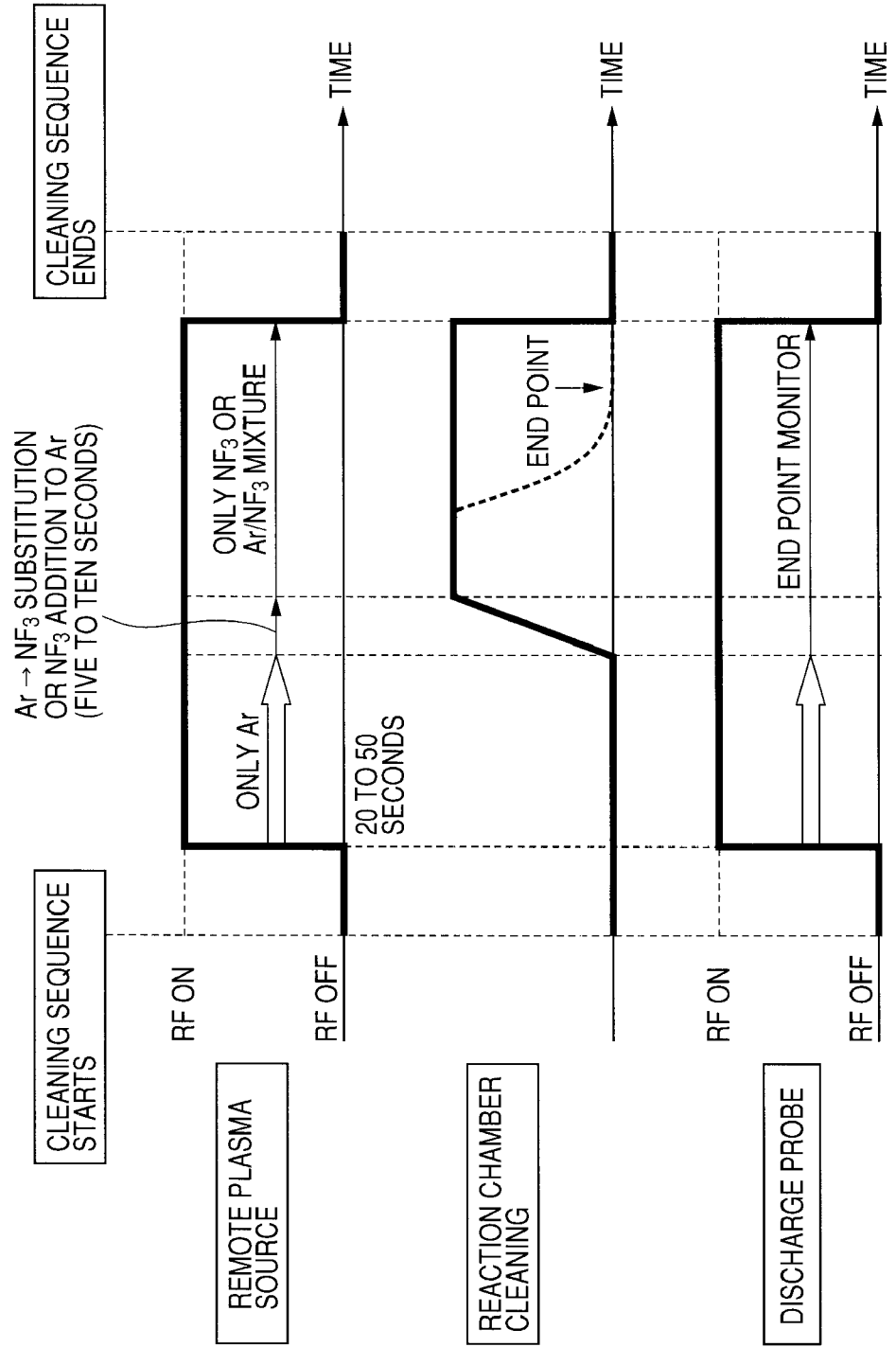
FIG. 5 is a time chart for illustrating discharge probe cleaning at the time of remote plasma cleaning in a plasma CVD process used in a manufacturing method of the semiconductor integrated circuit device according to an embodiment of the present invention.

FIG. 5 shows a time chart for illustrating discharge probe cleaning at the time of remote plasma cleaning. The tip portion of the discharge probe 71 is cleaned naturally during its use, however, the following processing will bring about the effect to improve the probe characteristics (ignitability, discharge stability). As shown in the same figure, on the occasion of the cleaning of the reaction chamber 52, a plasma is excited in the remote plasma generation chamber 100 and by the discharge probe 71. A plasma is not at all excited in the reaction chamber 52. In a state where a plasma is excited in the remote plasma generation chamber 100 and the discharge probe 71, a gas containing an inert gas as its main component, for example, an argon gas (gas containing argon as its main component) is flowed into the reaction chamber 52 and the remote plasma generation chamber 100 and the gas flow passes near the discharge probe 71 and is discharged. At this time, the tip portion 99 of the discharge probe 71 is cleaned. After that, the gas containing a cleaning gas is flowed and the cleaning of the reaction chamber 52 is performed (FIG. 5 shows, for the convenience of display, as if the cleaning continues after the end point is detected, but in the actual remote plasma cleaning, the cleaning sequence is automatically terminated when the end point is detected). Normally, the discharge probe cleaning may be performed during the period of argon purge (from five to ten seconds) before the remote plasma cleaning (normal discharge probe cleaning). If the period of time is lengthened to about 20 to 50 seconds, for example, 40 seconds (enhanced discharge probe cleaning), it is possible to considerably restore the state of the tip of the discharge probe 71. Consequently, it may also be possible to perform the normal discharge probe cleaning almost each time (for a single wafer) and perform the enhanced discharge probe cleaning once out of several times or for each lot. It is of course possible to perform each time. However, it is necessary to take the wear of electrode into consideration.

2. Description of Process Suitable for Element Isolation Process (mainly from FIG. 6 to FIG. 10)

The process suitable for the element isolation groove embedding process in the element isolation process of shallow trench isolation (STI) type with reference to FIG. 6 to FIG. 10. The element isolation groove embedding process is performed by the high density plasma CVD (HDP-CVD) method. As a plasma furnace, the ICP type high density plasma CVD furnace of single wafer type shown in FIG. 1 is used. In this system, the vacuum region of about 0.27 Pa to 1.3 Pa is used in general. The reaction gas is in general monosilane.

The operation procedure of the HDP-CVD apparatus is described with reference to FIG. 6. First, a pre-cleaning process 31 for improving the degree of cleanness of the device to a certain level is performed (in a state without wafer to be processed). Next, a pre-coat process 32 for depositing an oxide film on the inner surface and other portions in the processing chamber 52 is performed (in a state without wafer to be processed). Subsequently, film forming processing 33 is performed in a state where the wafer 1 (first wafer) is set on the wafer stage 54 in the processing chamber 52. When film formation is completed, the wafer 1 is discharged from the processing chamber 52. After that, in a state where no wafer to be processed is present in the processing chamber 52, a remote plasma cleaning process 34 is performed. After that, similarly as before, in the state where the wafer 1 (second wafer) is set on the wafer stage 54 in the processing chamber 52, the same film forming processing 33 as before is performed. Then, the remote plasma cleaning process 34 and the film forming processing 33 are repeated until the processing of all of the wafers belonging to a predetermined lot is completed (film forming/cleaning circulation process). When the processing of all of the wafers belonging to a predetermined lot is completed, the pre-cleaning process 31 and the pre-coat process 32 are performed before the next lot is processed and then the film forming/cleaning circulation process is entered. Depending on conditions, the pre-cleaning process 31 and the pre-coat process 32 may be performed in the reversed order (refer to FIG. 15).

Figure 6:
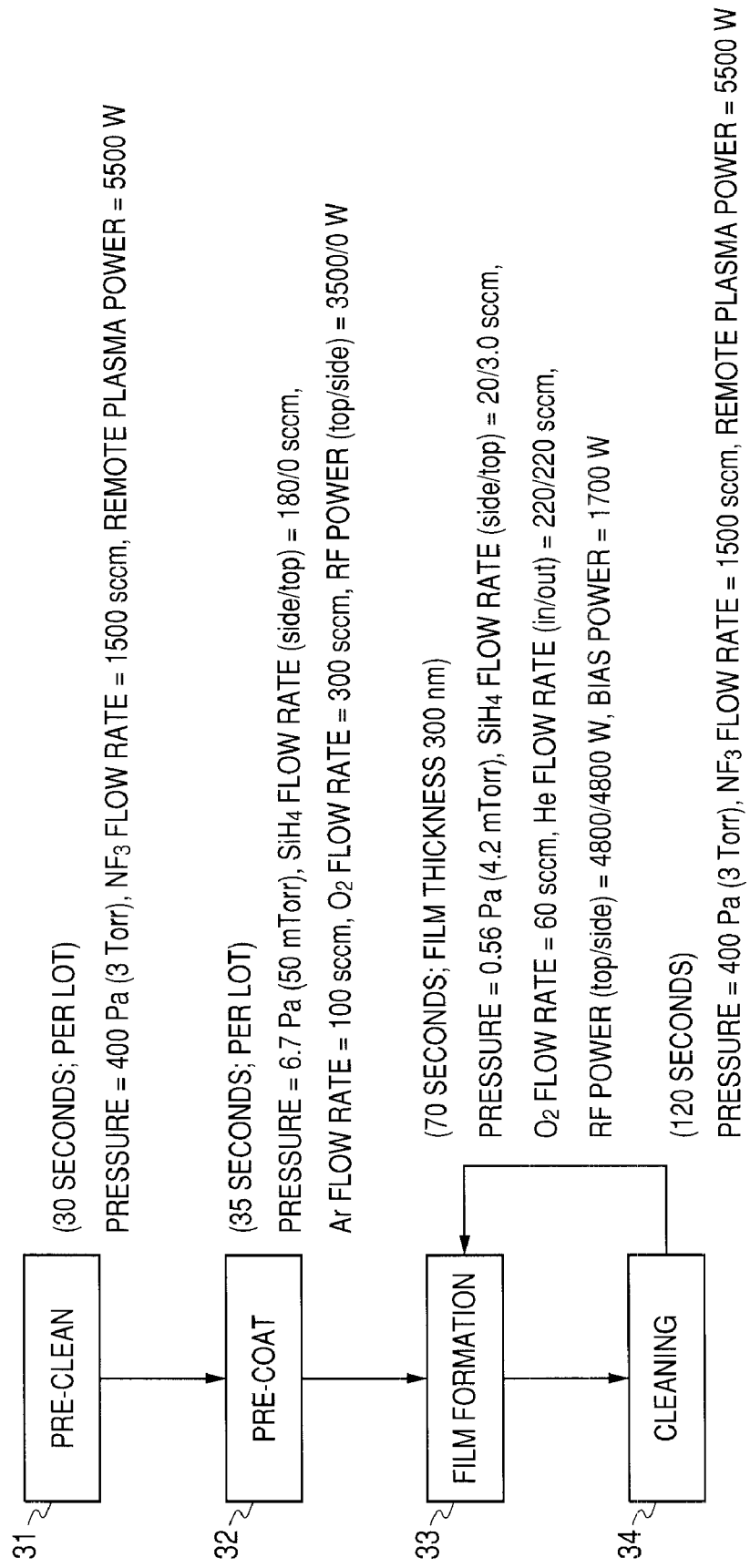
FIG. 6 is a device processing flow diagram showing an example of a plasma CVD process used in a manufacturing method of the semiconductor integrated circuit device according to an embodiment of the present invention.
Figure 7:
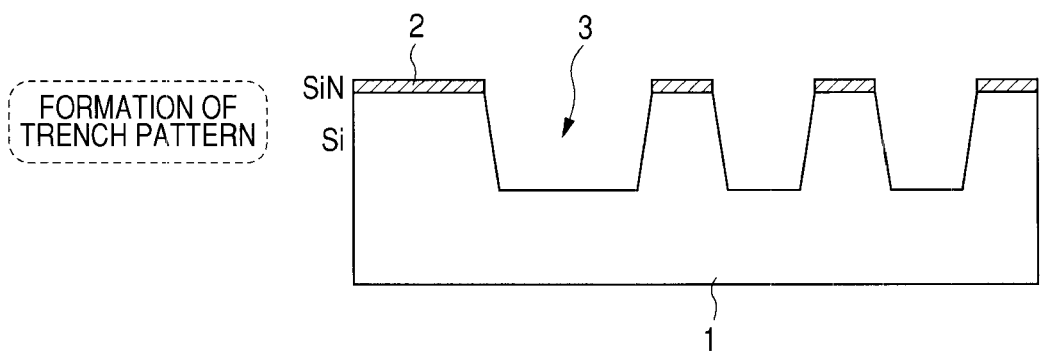
FIG. 7 is a device sectional view showing an element isolation groove forming process in an element isolation process, which is an example of a plasma CVD process used in a manufacturing method of the semiconductor integrated circuit device according to an embodiment of the present invention.

The film forming process 33 in FIG. 6 is described in detail with reference to FIG. 7 to FIG. 10. FIG. 7 is a device sectional view in an element isolation groove forming process. An element isolation groove 3 is formed in the silicon wafer (substrate) 1 using a silicon nitride film 2 as a mask against dry etching.

Figure 8:
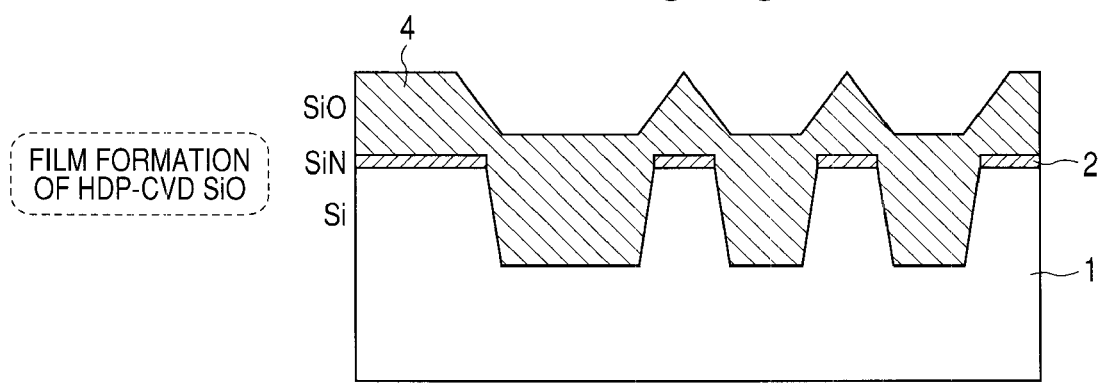
FIG. 8 is a device sectional view showing an element isolation groove embedding process in an element isolation process, which is an example of a plasma CVD process used in a manufacturing method of the semiconductor integrated circuit device according to an embodiment of the present invention.

FIG. 8 shows an element isolation groove embedding process. A CVD silicon oxide film 4 is embedded in the previous element isolation groove 3 (CVD process 1; HDP-CVD-1).

Figure 9:
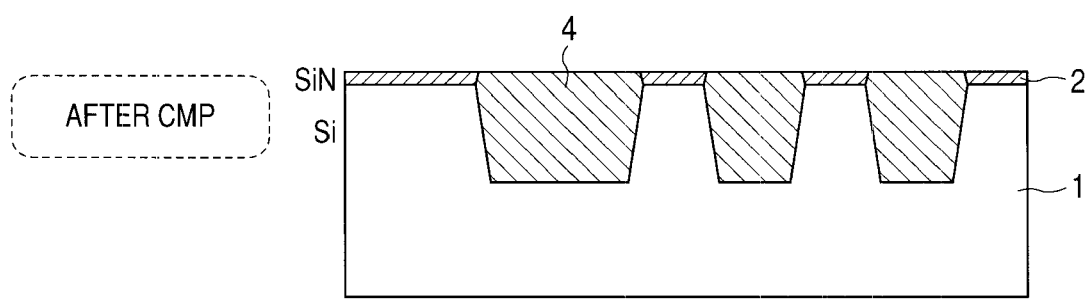
FIG. 9 is a device sectional view showing an element isolation CMP process in an element isolation process, which is an example of a plasma CVD process used in a manufacturing method of the semiconductor integrated circuit device according to an embodiment of the present invention.

FIG. 9 is a device sectional view when a CMP process is completed. Here, the CVD silicon oxide film 4 other than that in the element isolation groove 3 is removed.

Figure 10:
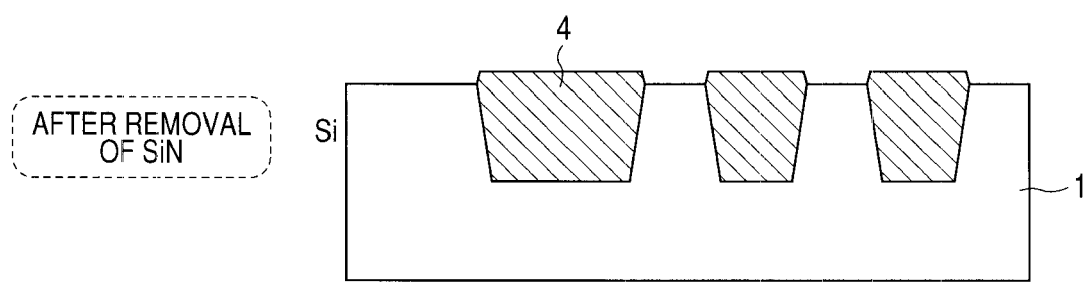
FIG. 10 is a device sectional view showing a silicon nitride element isolation patterning film removing process in an element isolation process, which is an example of a plasma CVD process used in a manufacturing method of the semiconductor integrated circuit device according to an embodiment of the present invention.

FIG. 10 shows a silicon nitride film removing process. Here, the silicon nitride film 2 is removed by wet etching.

3. Description of Process Suitable for Aluminum Wiring Process (mainly from FIG. 11 to FIG. 14)

The cleaning end point detecting technique and the operation procedure of the HDP-CVD apparatus (FIG. 6) described in section 2 can be similarly applied to the HDP-CVD etc. for forming an inter-layer dielectric (ILD) film in an aluminum wiring process.

Figure 11:
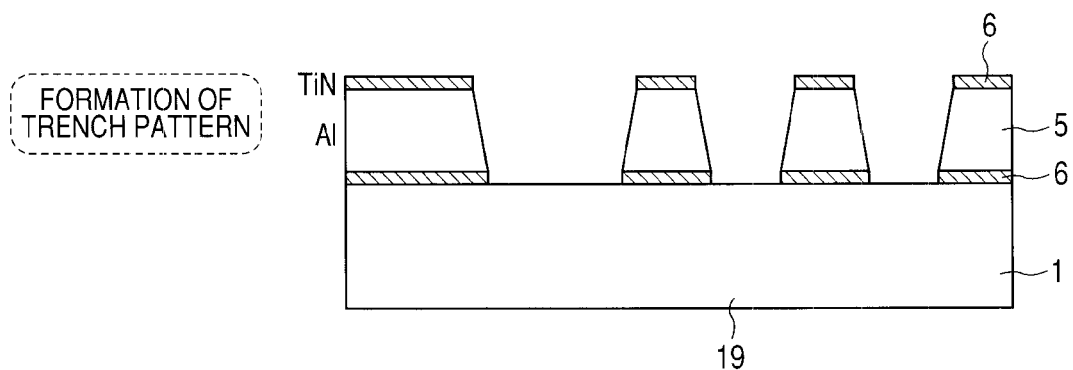
FIG. 11 is a device sectional view showing a wiring pattern forming process in an aluminum wiring process, which is an example of a plasma CVD process used in a manufacturing method of the semiconductor integrated circuit device according to an embodiment of the present invention.

An ILD film forming process is described with reference to FIG. 11 to FIG. 14. FIG. 11 is a device sectional view in the aluminum wiring patterning process. The aluminum wiring formed on an ILD film 19 in the lower layer includes an aluminum alloy layer 5 in the middle and a barrier metal layer 6, such as TiN, thereon and thereunder. In general, the aluminum wiring patterning is performed by dry etching using a resist film as a mask against etching.

Figure 12:
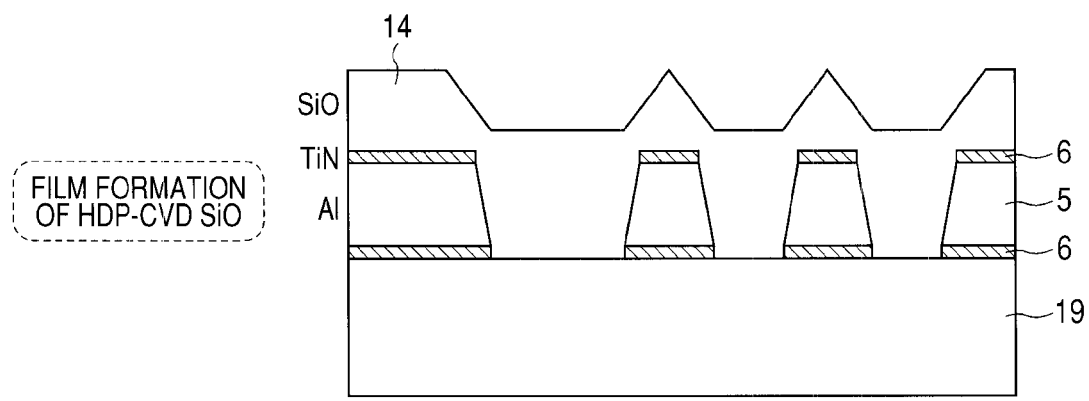
FIG. 12 is a device sectional view showing a wiring pattern embedding process 1 in an aluminum wiring process, which is an example of a plasma CVD process used in a manufacturing method of the semiconductor integrated circuit device according to an embodiment of the present invention.
Figure 13:
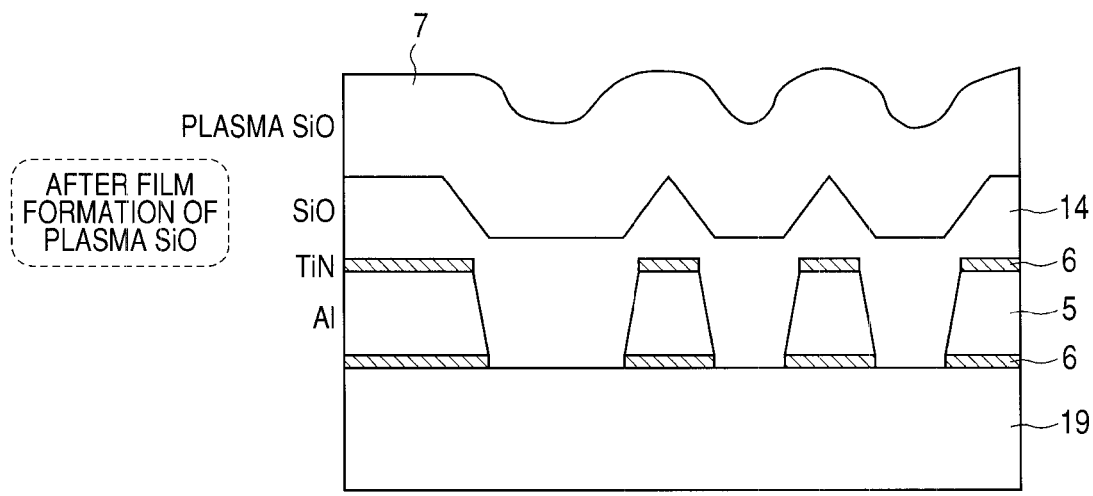
FIG. 13 is a device sectional view showing a wiring pattern embedding process 2 in an aluminum wiring process, which is an example of a plasma CVD process used in a manufacturing method of the semiconductor integrated circuit device according to an embodiment of the present invention.
Figure 14:
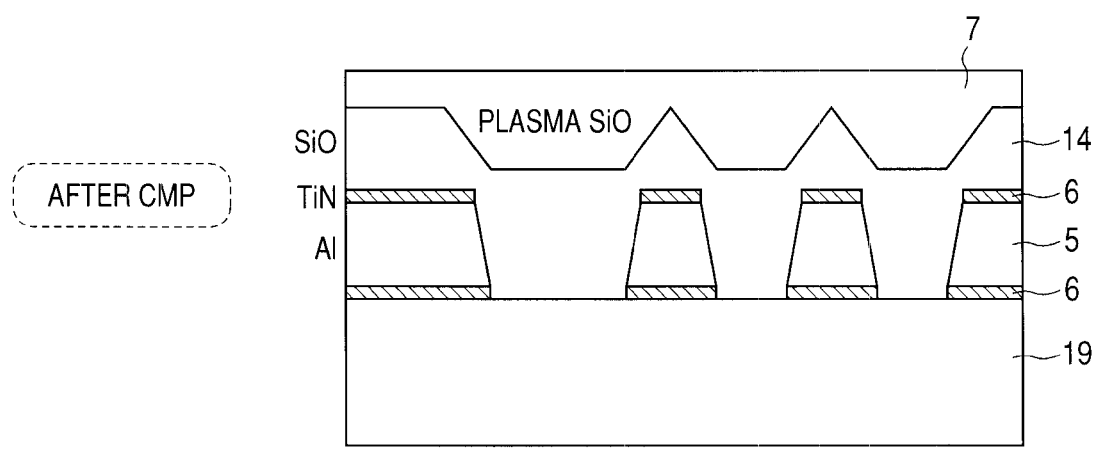
FIG. 14 is a device sectional view showing a wiring interlayer insulating film CMP process in an aluminum wiring process, which is an example of a plasma CVD process used in a manufacturing method of the semiconductor integrated circuit device according to an embodiment of the present invention.

FIG. 12 shows a state of completion of film formation of an HDP-CVD film 14 (CVD process 2; HDP-CVD-2). As shown in FIG. 13, a plasma CVD silicon oxide film using tetraethyl-orthosilicate (TEOS), that is, a P-TEOS $SiO_2$ film 7 is formed thereon (CVD process 3; P-TEOS-1). After that, flattening processing by CMP is performed. Further, in some cases, a thin P-TEOS $SiO_2$ film etc. having a thickness of about 50 to 100 nm is formed after the CMP processing. The same cleaning end point detecting technique and the operation procedure of device (FIG. 6) as those before can be applied to these CVD processes. FIG. 14 is a device sectional view when the inter-layer CMP process is completed.

In general, the P-TEOS process is performed using a single wafer plasma furnace (not of high density type), which resembles but somewhat differs from the furnace shown in FIG. 1. The pressure region used is in general from 67 Pa to 2000 Pa.

4. Description of Process Suitable for Pre-metal Process (mainly from FIG. 15 to FIG. 19)

With reference to FIG. 15 to FIG. 19, a case is described, where a non-doped silicate glass (NSG) film, that is, a non-doped silicon oxide film, in the pre-metal insulating film forming process is formed under the atmospheric pressure, that is about $1.0 \times 10^5$ Pa or the sub-atmospheric pressure (about 2,700 Pa to 80,000 Pa) by the thermal CVD method using ozone and TEOS (tetraethyl-orthosilicate) (so-called ozone TEOS silicon oxide film). The vacuum pumping system in this case has a single pump configuration in general and uses a mechanical dry pump as its main pump. In general, the CVD under the atmospheric pressure is called atmospheric CVD (AP-CVD) and that under the sub-atmospheric pressure is called sub-atmospheric CVD (SA-CVD). For the former, a batch furnace is used in general and for the latter, a single wafer furnace (not a plasma furnace) that resembles that described in FIG. 1 is used. The case where the single wafer furnace is used is described below specifically.

Figure 15:
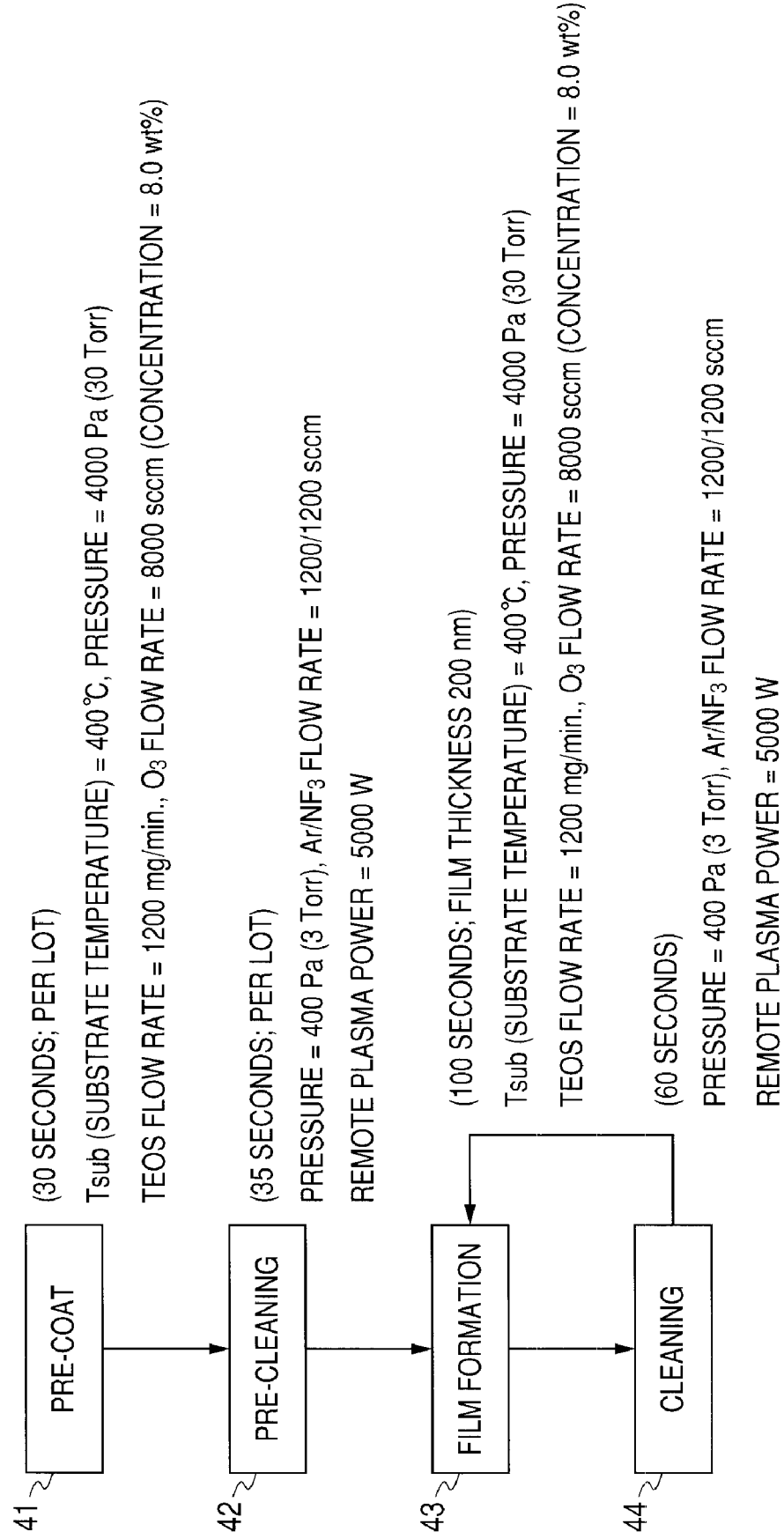
FIG. 15 is a device processing flow diagram showing an example of a thermal CVD process used in a manufacturing method of the semiconductor integrated circuit device according to an embodiment of the present invention.

FIG. 15 shows an example of an operation procedure of device similar to that in FIG. 6. The order of a pre-coat 41 and a pre-cleaning 42 is reversed from that in the previous figure, however, a film forming process 43 and a cleaning process 44 are almost the same except for detailed conditions. The order of the pre-processing may be changed appropriately depending on the processes and the device characteristics, and therefore, their duplicated description is avoided. The details of the processes are described below with reference to FIG. 16 to FIG. 19.

Figure 16:
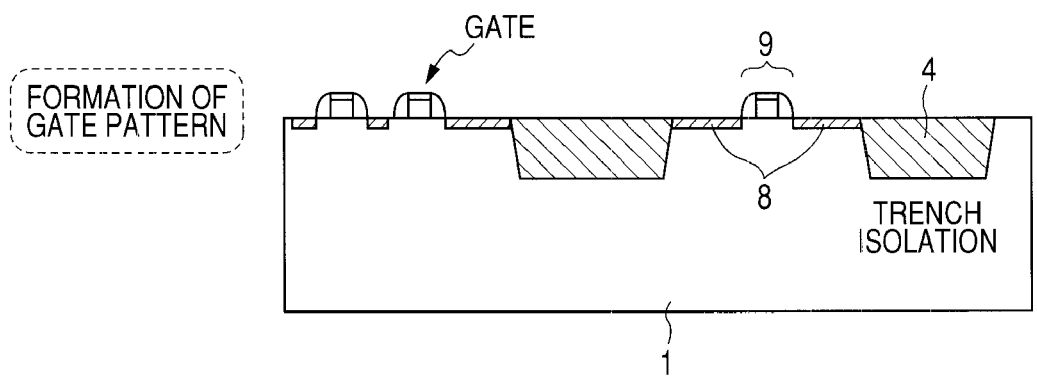
FIG. 16 is a device sectional view showing a gate forming process in a gate formation/pre-metal process, which is an example of a thermal CVD process used in a manufacturing method of the semiconductor integrated circuit device according to an embodiment of the present invention.

FIG. 16 is a schematic device sectional view when the gate electrode pattern is involved. A gate electrode portion 9 and a source or drain region 8 on a first main surface (device surface) of the substrate 1 therearound are formed.

Figure 17:
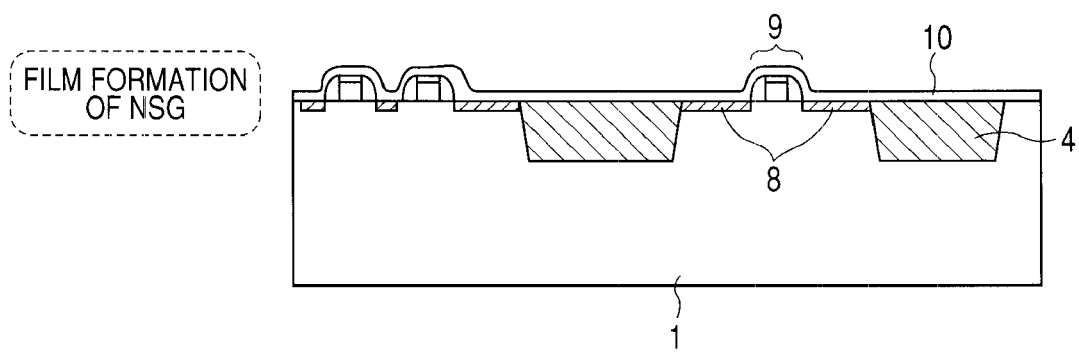
FIG. 17 is a device sectional view showing an on-gate NSG film forming process in a gate formation/pre-metal process, which is an example of a thermal CVD process used in a manufacturing method of the semiconductor integrated circuit device according to an embodiment of the present invention.
Figure 18:
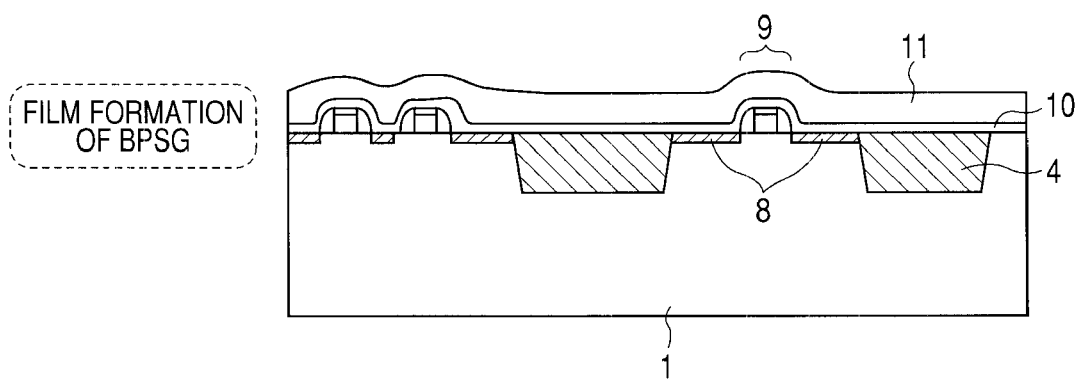
FIG. 18 is a device sectional view showing an on-gate BPSG film forming process in a gate formation/pre-metal process, which is an example of a thermal CVD process used in a manufacturing method of the semiconductor integrated circuit device according to an embodiment of the present invention.
Figure 19:
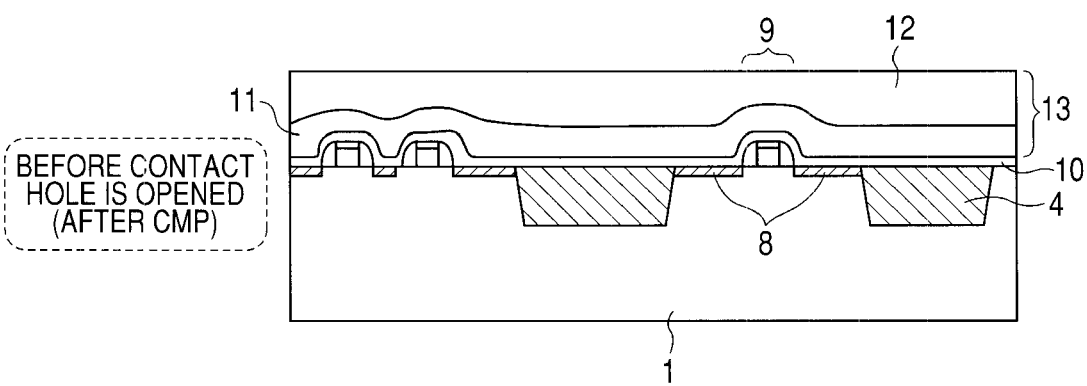
FIG. 19 is a device sectional view showing a CMP process in a gate formation/pre-metal process, which is an example of a thermal CVD process used in a manufacturing method of the semiconductor integrated circuit device according to an embodiment of the present invention.

FIG. 17 shows a sectional structure after an NSG-CVD film 10 is formed (CVD process 5; $O_3$-TEOS-1). FIG. 18 is a device sectional view when a borophosphosilicate glass (BPSG) film 11 is formed thereon by the thermal CVD method similarly (CVD process 6; $O_3$-TEOS-2). In this case, as a process gas, trimethylphosphite (TMP), triethylphosphate (TEPO), trimethylborate (TMB), triethylborate (TEB), etc., are used. FIG. 19 shows a device sectional view when the CMP for a pre-metal insulating film 13 is completed after a P-TEOS $SiO_2$ film 12 similar to the previous one is formed further thereon (CVD process 7: P-TEOS-3).

5. Description of Illustrative Sectional Structure of Target Device (mainly, FIG. 20)

Figure 20:
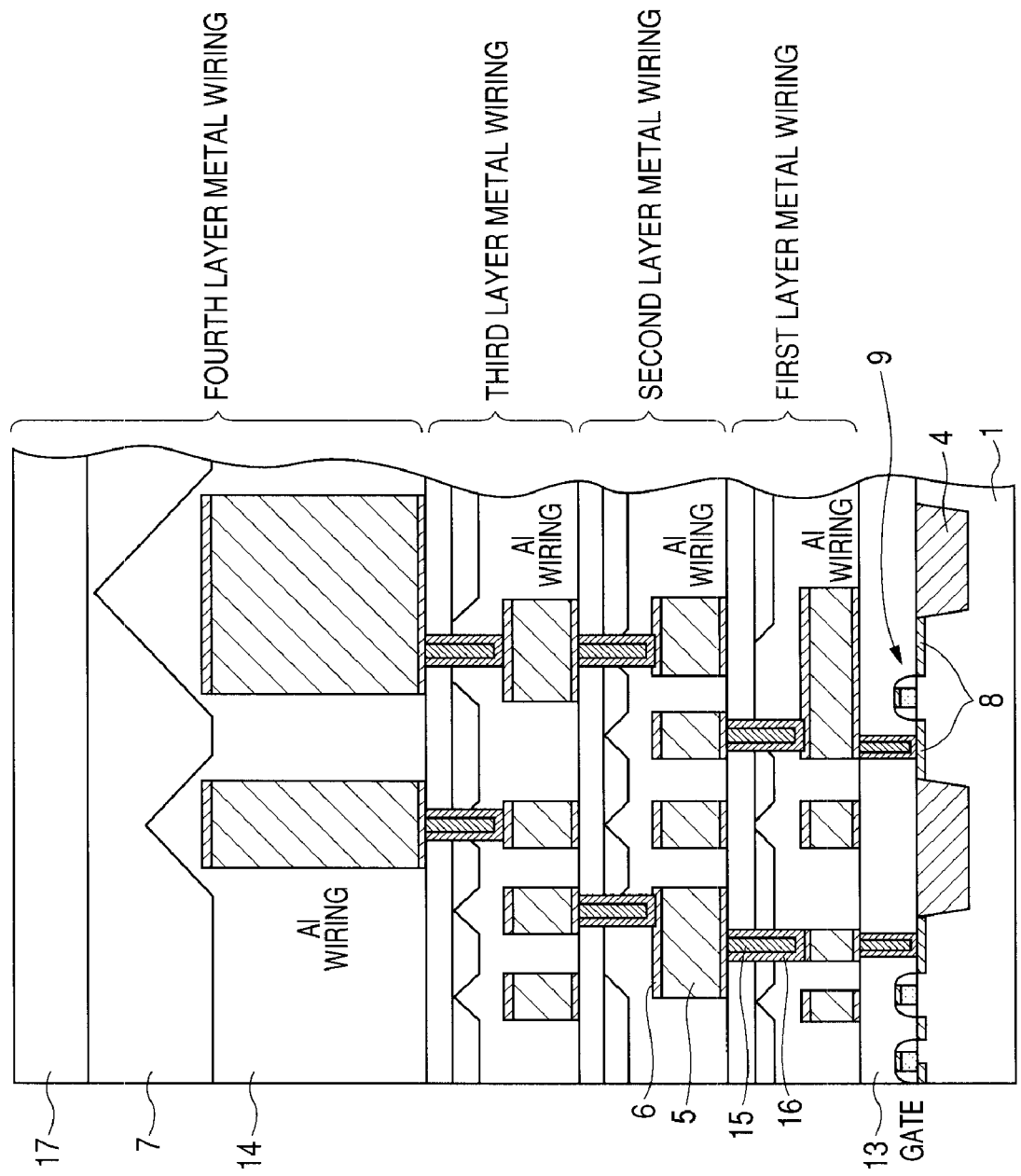
FIG. 20 is a device sectional view showing an example of a device manufactured by a manufacturing method of the semiconductor integrated circuit device according to an embodiment of the present invention.

FIG. 20 is a sectional view showing an example of a semiconductor integrated circuit device of MOS or MIS type having a four-layer aluminum wiring manufactured by the application of the process and technique described in sections 2 to 4. The aluminum wirings are connected to one another with a tungsten plug 15 surrounded by a barrier metal layer 16 made of TiN etc. A film 17 in the uppermost layer is a final passivation film (CVD process 8; P-SiN-1) made of plasma silicon nitride etc.

6. Application of Reaction Chamber Cleaning and its End Point Detection to each CVD Process The detection procedure of cleaning end point described in section 1 can be applied to the CVD processes 1 to 8. The preprocessing of the device at this time as to the CVD processes 1 to 2 corresponds to that described in FIG. 6 in section 2 and that as to the CVD processes 3 to 8 corresponds to that described in FIG. 15 in section 4. The preprocessing of device is performed for each lot (for example, every 25 wafers, or 12 wafers), however, it may also be possible to carry out every appropriate number of wafers (including variable numbers, indefinite numbers) despite the units of lots of mass production.

When it is possible to ensure the degree of stability of process, it is not necessarily required to perform the normal reaction chamber cleaning for each wafer. It may also be possible to perform the wafer processing for each wafer, every two, three, . . . , twelve wafers, which is an appropriate number, or for each lot.

7. Description of Flat-plate Type Excitation Antenna Portion (mainly from FIG. 21 to FIG. 24)

Various forms can be considered for an excitation antenna portion 71. The variations of the excitation antenna portion 71 are described below with reference to FIG. 21 to FIG. 34. First, the variations of the flat-plate type excitation antenna portion shown in FIG. 2 are described with reference to FIG. 21 to FIG. 24.

First, the form (example in FIG. 21) equivalent to that described in FIG. 2 is described for comparison with others. The front (when viewed from the interior of the device) of the tip portion 99 is substantially flat including the peripheral pipe wall and the excitation electrode portion 81 having a comparatively small area is surrounded by the comparatively wide ground electrode portion 82. With such a structure, the local probe is substantially integrated with the main exhaust pipe wall, and therefore, its structure is simple, durable, and undesired deposit is unlikely to stick because of a low exhaust gas flow rate. In addition, it is quite unlikely that the conductance of the exhaust pipe is reduced. On the other hand, there is a problem that information acquisition sensitivity about the reaction chamber decreases somewhat because of the low exhaust gas flow rate. The reason is that the excited plasma is thin and easily extended along the ground electrode portion surface, and therefore, the plasma does not extend as far as the center portion of the exhaust pipe (description is based on the assumption that the inner diameter of the exhaust pipe is 50 mm, and this applies hereinafter) even if considerably strong power is applied due to the smallness of the excitation electrode portion and the presence of the comparatively large ground electrode portion therearound. These merits and demerits are basically common to those of flat-plate type.

Figure 22A:
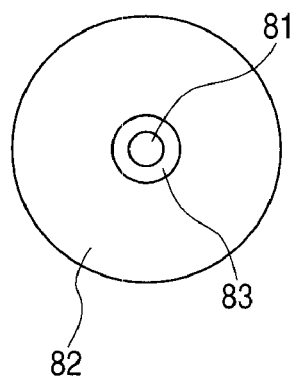
FIG. 22 is a schematic side sectional view showing an example of the flat-plate type local plasma excitation antenna portion for detecting the end point of cleaning of a plasma CVD apparatus used in a manufacturing method of the semiconductor integrated circuit device according to an embodiment of the present invention.
Figure 22B:
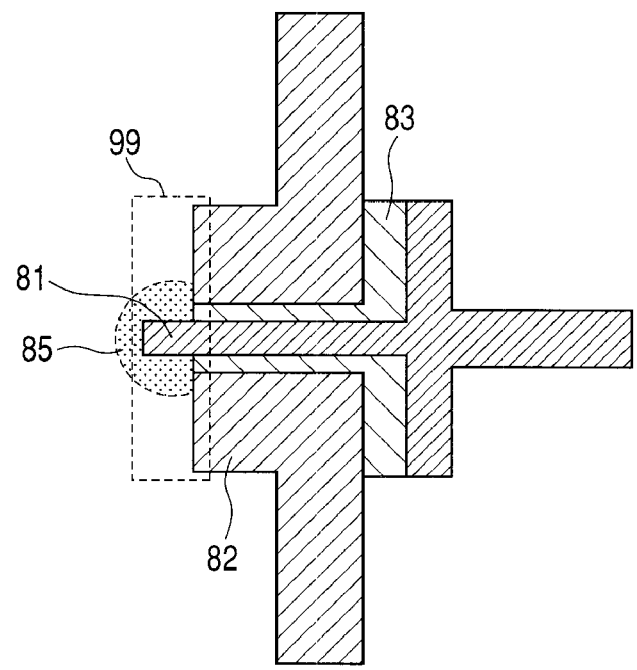

The example in FIG. 22 is characterized in that the excitation electrode portion 81 projects somewhat from the front of the ground electrode portion 82. Due to this, the improvement of the ignitability and the stability of discharge can be expected, however, there is a problem in the durability of the electrode itself (wear occurs in the excitation electrode portion) etc.

Figure 23A:
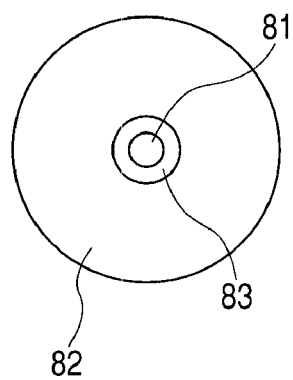
FIG. 23 is a schematic side sectional view showing an example of the flat-plate type local plasma excitation antenna portion for detecting the end point of cleaning of a plasma CVD apparatus used in a manufacturing method of the semiconductor integrated circuit device according to an embodiment of the present invention.
Figure 23B:
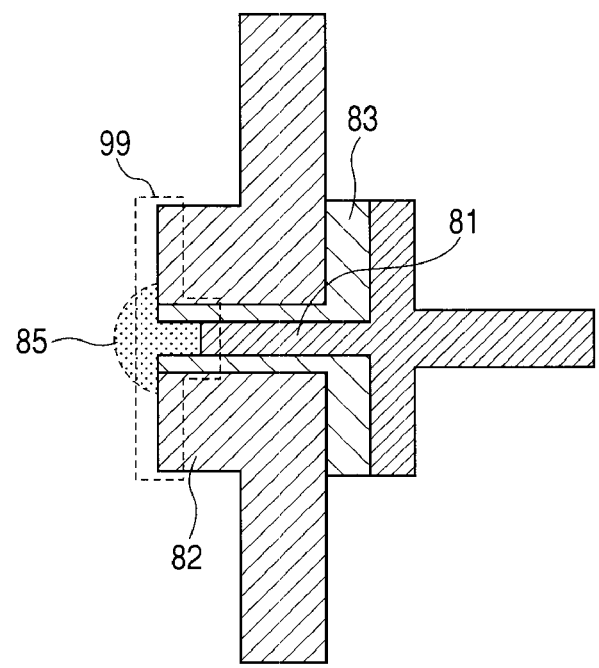

On the contrary, the example in FIG. 23 is characterized in that the excitation electrode portion 81 sinks somewhat from the front of the ground electrode portion 82. The effect is just opposite to that in FIG. 22. That is, the wear of the excitation electrode portion is small, however, there is a problem in the ignitability and the stability of discharge.

Figure 24A:
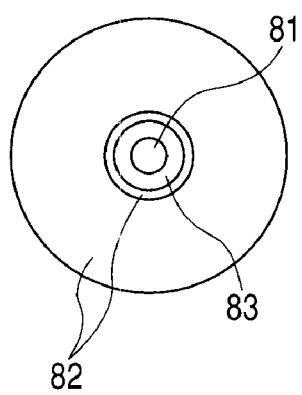
FIG. 24 is a schematic side sectional view showing an example of the flat-plate type local plasma excitation antenna portion for detecting the end point of cleaning of a plasma CVD apparatus used in a manufacturing method of the semiconductor integrated circuit device according to an embodiment of the present invention.
Figure 24B:
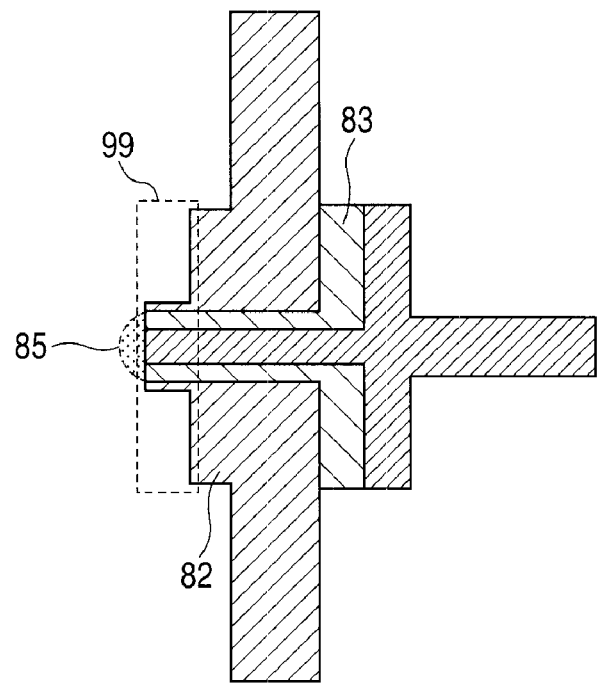
Figure 25B:
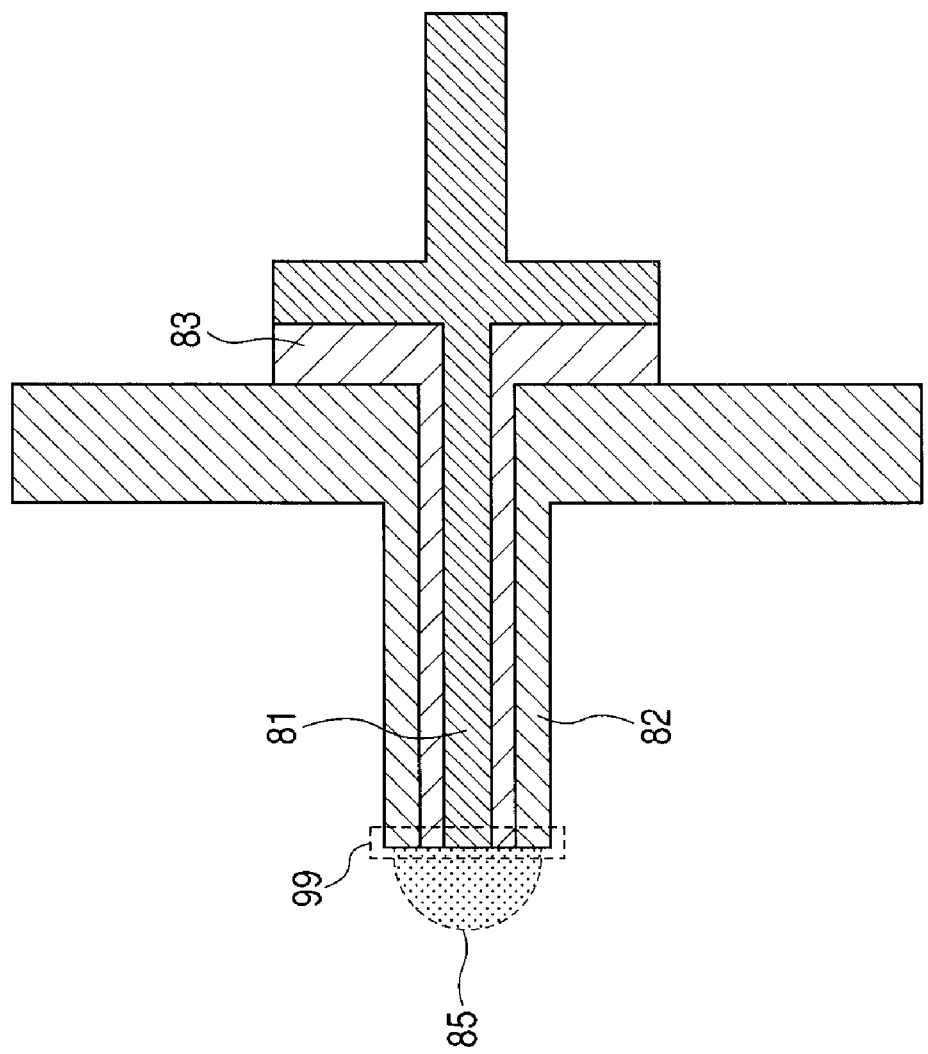
FIG. 25 is a schematic side sectional view showing an example of a coaxial type local plasma excitation antenna portion for detecting the end point of cleaning of a plasma CVD apparatus used in a manufacturing method of the semiconductor integrated circuit device according to an embodiment of the present invention.
Figure 25A:
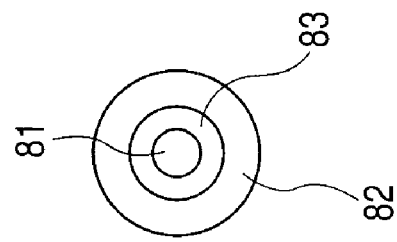

The example in FIG. 24 is basically the same as that in FIG. 22, however, it differs in that part of the interelectrode insulating portion 83 and the ground electrode portion 82 rise to the same height as that of the projecting (about 10 mm) excitation electrode portion 81 like the coaxial cable so that it covers the projecting electrode portion 81 (as same as the coaxial type in FIG. 25 except for the degree of projection). Due to this, its characteristics are intermediate between the flat-plate type and the coaxial type to be described in section 8.

8. Description of Excitation Antenna Portion of Coaxial Type (mainly from FIG. 25 to FIG. 27)

Figure 26B:
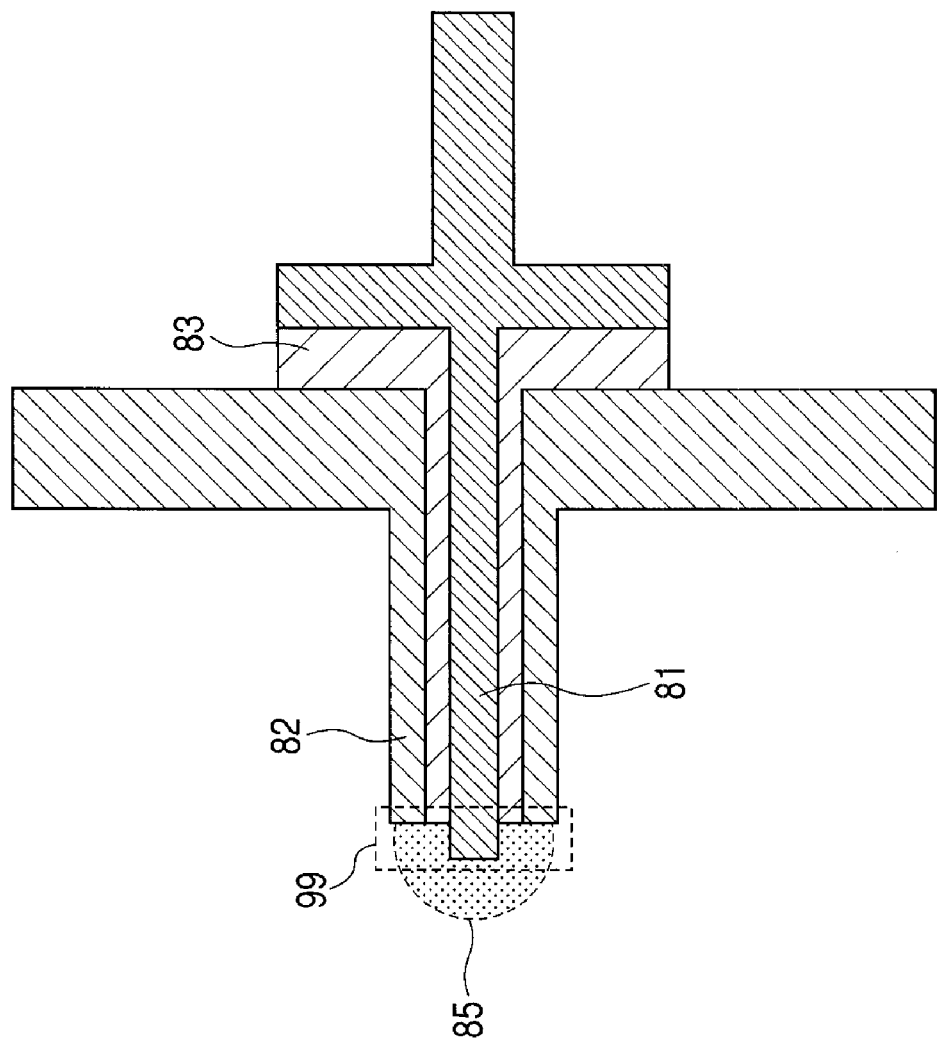
FIG. 26 is a schematic side sectional view showing an example of the coaxial type local plasma excitation antenna portion for detecting the end point of cleaning of a plasma CVD apparatus used in a manufacturing method of the semiconductor integrated circuit device according to an embodiment of the present invention.
Figure 26A:
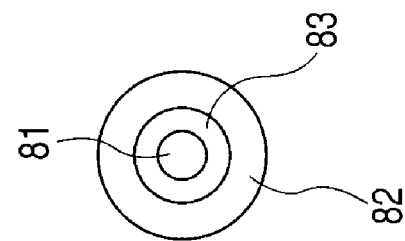
Figure 27A:
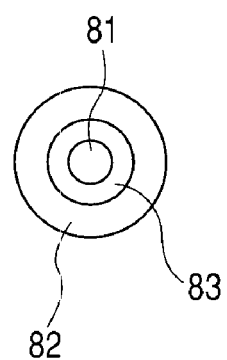
FIG. 27 is a schematic side sectional view showing an example of the coaxial type local plasma excitation antenna portion for detecting the end point of cleaning of a plasma CVD apparatus used in a manufacturing method of the semiconductor integrated circuit device according to an embodiment of the present invention.
Figure 27B:
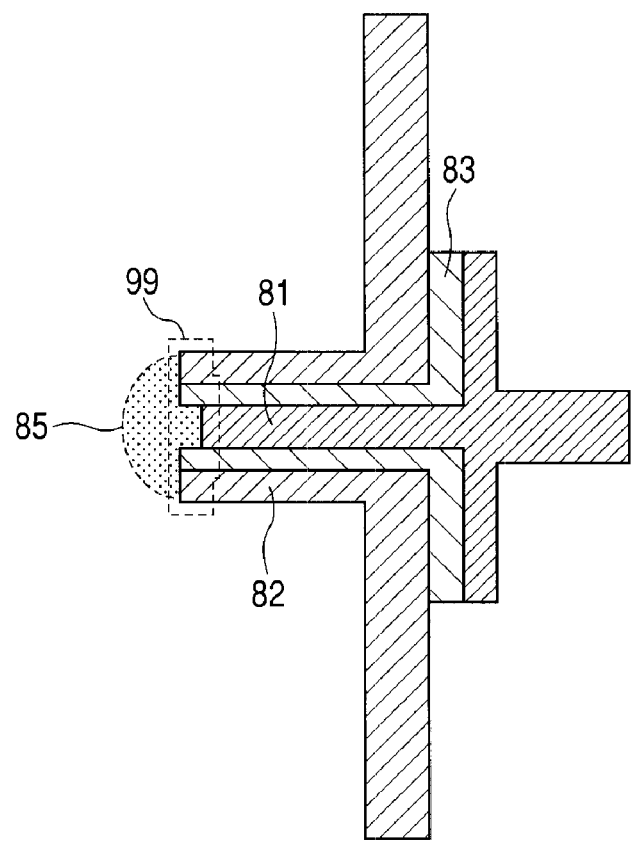

FIG. 25 to FIG. 27 each show an example of the excitation antenna portion of coaxial cable type. The example in FIG. 25 shows the typical coaxial type. Compared to the flat-plate type, it projects 15 mm to 20 mm or more from the intermediate wall of the exhaust pipe toward its interior (desirably, the tip of the probe, that is, the excitation electrode surface is on the center line of the exhaust pipe or in the vicinity thereof). Other dimensions are substantially the same as those of the above-mentioned flat-plate type, and the thickness of the electrode around the coaxial cable (shield) is, for example, 0.5 mm (the diameter of the probe tip portion is about 10 mm). The merit is that it is easy to obtain information on the film formation reaction chamber 52 because the plasma is generated in the vicinity of the center axis of the exhaust pipe in which the exhaust flow rate is large. In addition, because it is located distant from the inner wall of the exhaust pipe, the information from the deposit deposited thereon is unlikely to be obtained, and therefore, it is made possible to purely collect the information about the film formation reaction chamber 52. Further, the ground electrode portion is thin and the plasma does not spread so much, and therefore, this is an advantage in obtaining information limited to the gas that flows in the vicinity of the center axis of the exhaust pipe. On the other hand, deposit is easy to stick. A wear of the electrode occurs. The exhaust flow is somewhat impeded. There is also a demerit that it is somewhat harder to manufacture compared to the flat-plate type. These merit/demerit are basically common to the coaxial type.

The example in FIG. 26 is characterized in that the excitation electrode portion 81 projects somewhat from the front of the ground electrode portion 82. Due to this, the ignitability is excellent in a wide pressure range. That is, it is possible to stably excite a plasma with comparatively low excitation power. However, there is a problem that the wear of the electrode is comparatively remarkable because of the projection of the electrode at the portion where the gas flow rate is large.

On the contrary, the example in FIG. 27 is characterized in that the excitation electrode portion 81 sinks somewhat from the front of the ground electrode portion 82. This is the opposite to the previous one and the wear of electrode is small for the coaxial type, however, there is a minor problem of ignitability.

9. Description of Excitation Antenna Portions of other Types (mainly from FIG. 28 to FIG. 34)

Structures of excitation antenna portions of other types are shown in FIG. 28 to FIG. 34.

Figure 28A:
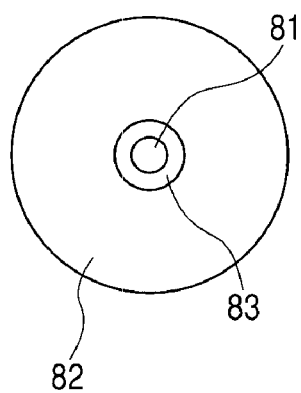
FIG. 28 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.
Figure 28B:
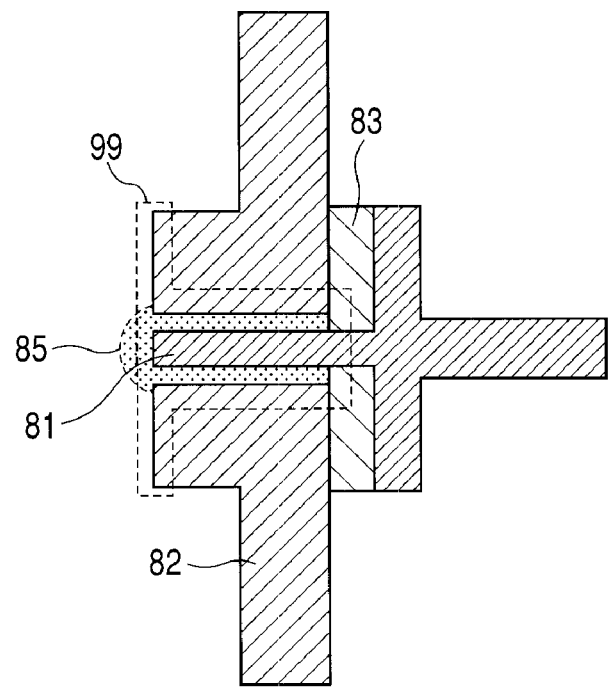

The example in FIG. 28 is characterized in that the interelectrode insulating portion between the excitation electrode portion 81 and the ground electrode portion 82 is almost removed. The merit is that the ignitability is excellent and it is easy to manufacture because of its structure. On the contrary, the demerit is that it becomes difficult to take out signals when deposit accumulates internally and that information about the interelectrode region of the discharge probe, which is not so much related to the reaction chamber 2, is collected because discharge occurs in the narrow gap between the electrodes.

The example in FIG. 29 is characterized in that the excitation electrode portion 81 and the ground electrode portion 82 form parallel lines. Since this is not of coaxial type, the merit is that it is easy to manufacture. On the contrary, the ignitability is poor and the plasma will be deformed, and therefore, there is a disadvantage when its purpose is to stably collect data of the center portion of the exhaust pipe.

Figure 21B:
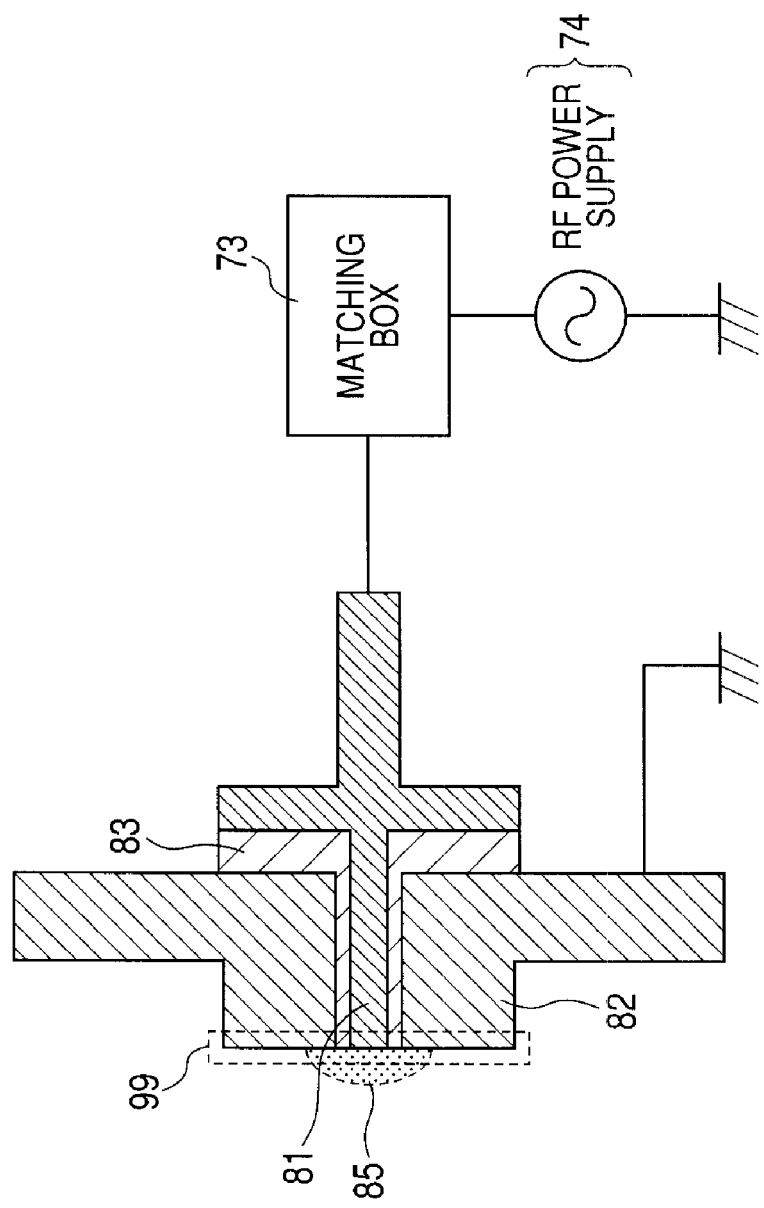
FIG. 21 is a schematic side sectional view showing an example of a flat-plate type local plasma excitation antenna portion for detecting the end point of cleaning of a plasma CVD apparatus used in a manufacturing method of the semiconductor integrated circuit device according to an embodiment of the present invention.
Figure 21A:
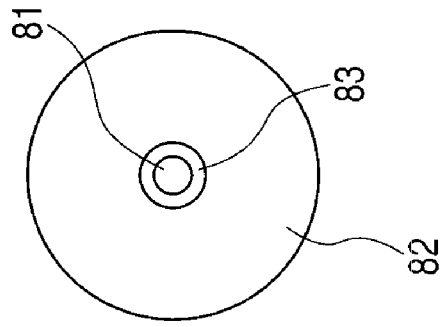
Figure 30A:
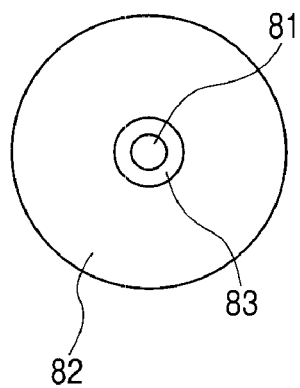
FIG. 30 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.
Figure 30B:
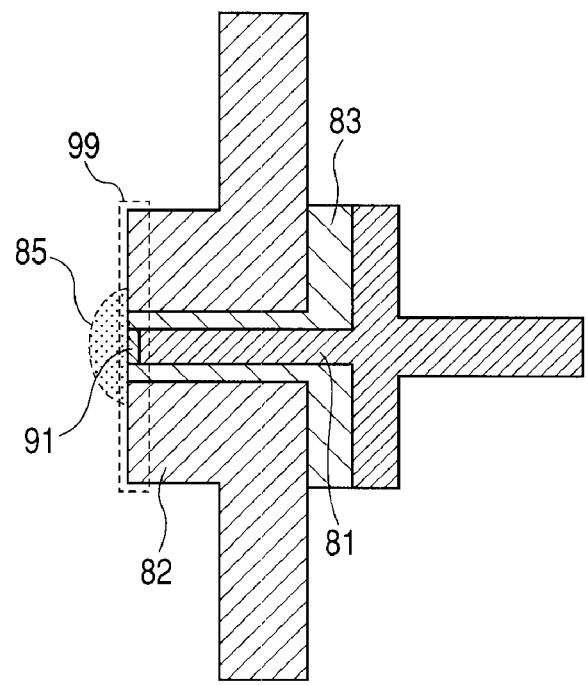

The example in FIG. 30 is basically the same as that in FIG. 21, and is characterized in that the tip portion of the excitation electrode portion 81 is covered with a thin insulating member 91 (for example, alumina ceramics, titania having a thickness of, for example, about 100 to 200 μm (silent discharge type). This is characterized in that the wear of electrode seldom occurs. In addition, discharge may occur even if the applied power has a low frequency (DC, or AC up to about 100 KHz). On the other hand, the trend is for the applied voltage to be raised somewhat. If the excitation electrode portion of each discharge probe of coaxial type is subjected to the same coating, the effect unique to the silent discharge (corona discharge, creeping discharge) described herein can be obtained as well as the effect unique thereto. Further, it is obvious that the same effect can be obtained by the application thereof to other respective discharging probes.

Figure 31A:
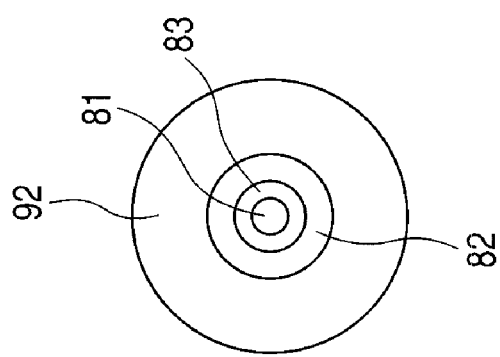
FIG. 31 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.
Figure 31B:
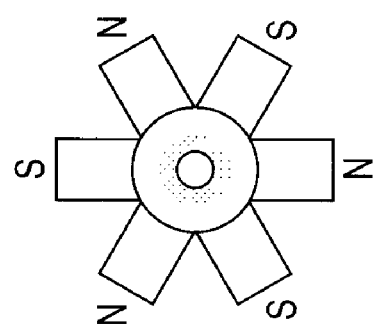
Figure 31C:
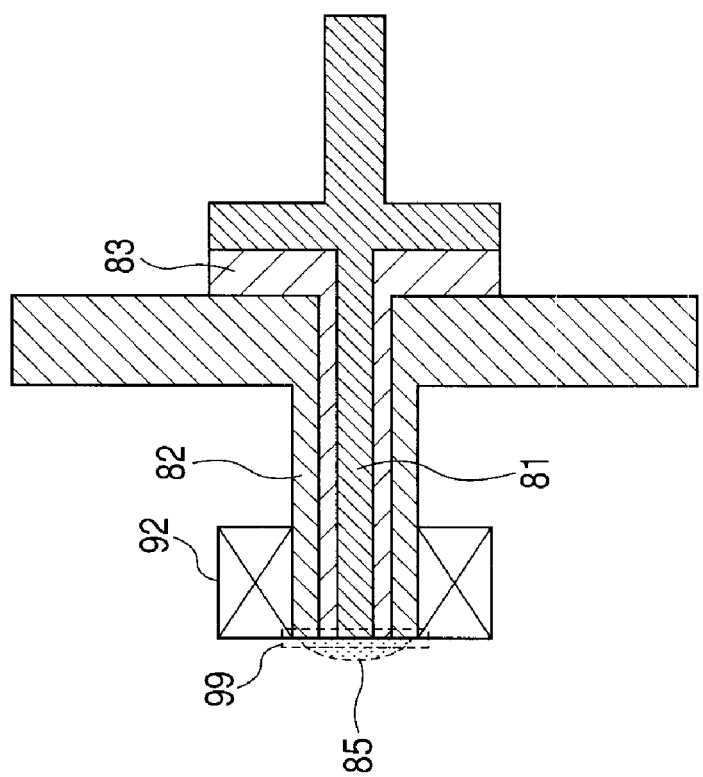

The example in FIG. 31 is basically the same as that in FIG. 25, however, it is characterized in that a magnetic field is applied to the tip portion 99 (magnetic field application system). The ignitability is excellent, a low voltage operation is possible, and the discharge stability is more excellent than that of coaxial type and flat-plate type. The change in voltage with time is slight. However, the possibility that evacuation is impeded is high. Deposit is easy to stick. The structure is complicated and its manufacture requires many man-hours and its cost is comparably high. With applied power having a low frequency (from DC up to about 100 KHz), the discharge is likely to become unstable etc.

Figure 32:
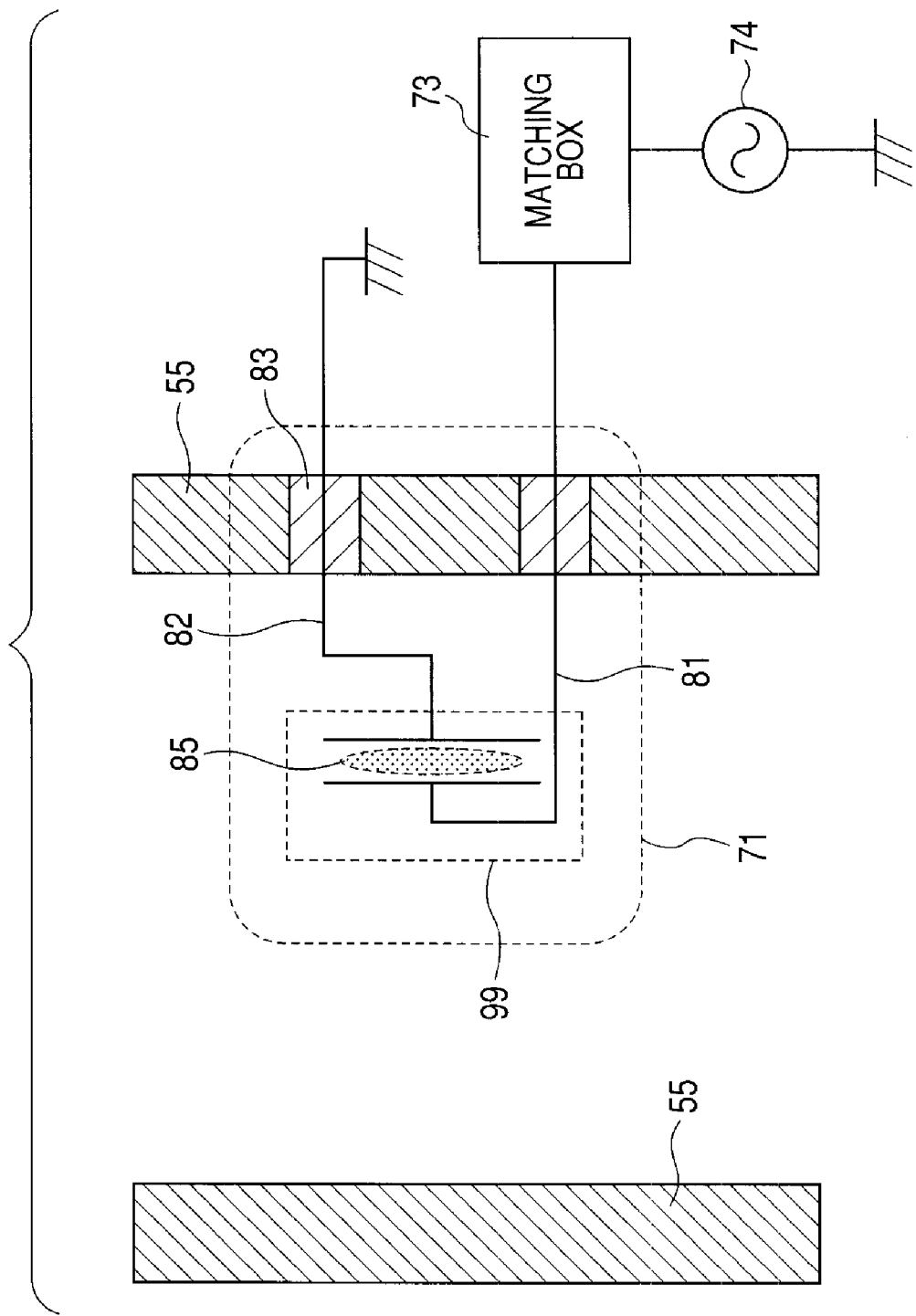
FIG. 32 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.

The example in FIG. 32 is of parallel flat-plate type (for example, its shape is like a disc, its diameter is 25 mm or less, and the electrode interval is 5 mm or less, for example, about 1 mm). The structure is simple and the ignitability and the discharge stability are excellent. Discharge may occur even if applied power has a low frequency (DC, or AC up to about 100 KHz). However, the possibility that evacuation is impeded is high. Deposit is easy to stick.

Figure 33:
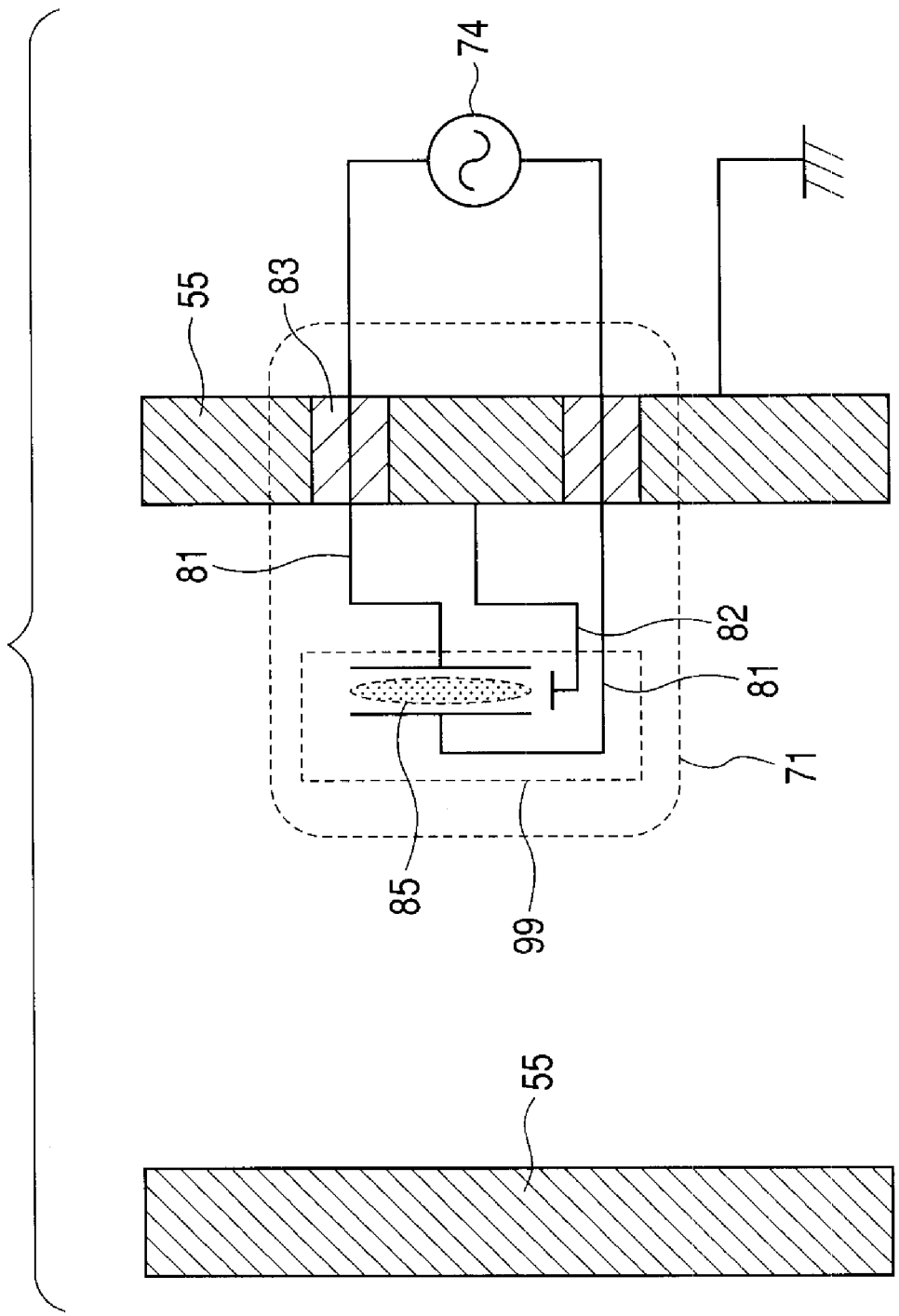
FIG. 33 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.

The example in FIG. 33 is of cathode follower type. Its size and characteristics are substantially the same as those in FIG. 32.

Figures 34A, 34B:
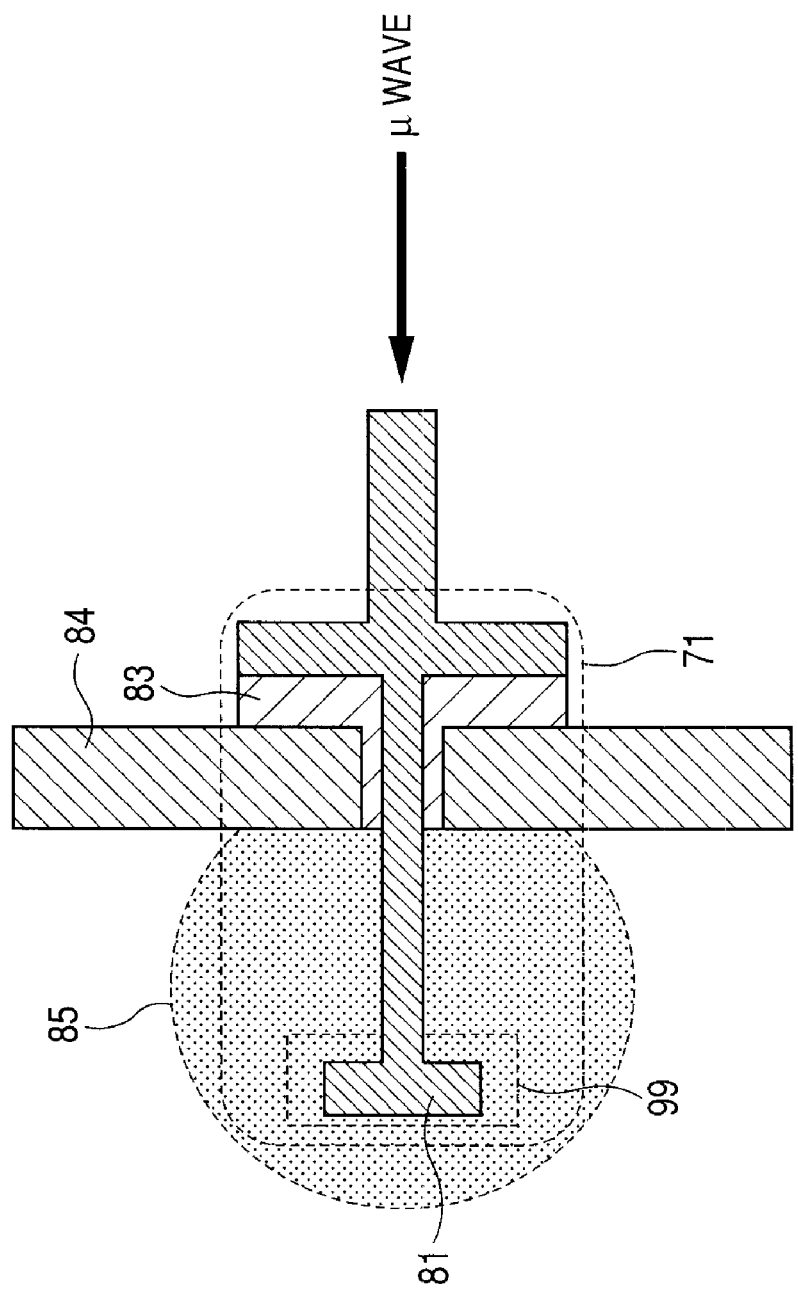
FIG. 34 is a schematic side sectional view showing an example of another type local plasma excitation antenna portion for detecting the end point of cleaning of a plasma CVD apparatus used in a manufacturing method of the semiconductor integrated circuit device according to an embodiment of the present invention.

The example in FIG. 34 is characterized by being of monopole type excited by microwaves. Its tip has the shape of a disc with a diameter of bout 40 mm and the diameter of its rod portion is about 10 mm. Both the ignitability and the discharge stability are excellent and discharge may occur in a wide pressure range (stability is higher in lower pressure regions). Discharge is stable even if applied power has a low frequency (from DC up to about 100 KHz). However, the possibility that the evacuation is impeded is high. Discharge characteristics are easy to change when deposit is stuck. Its structure is complicated and its cost is high.

10. Points of Note of Tip Portion of Discharge Probe

The following should be noted as to the tip portion of the discharge probe described above. The diameter of or the dimension across the local plasma for observation to be generated mainly depends on the diameter of or the dimension in the lengthwise direction across the excitation electrode (referred to as "excitation electrode dimension"). Consequently, it is desirable to excite, if possible, only the gas that flows through the center of the exhaust pipe (here, an example is described, in which the inner diameter of the exhaust pipe in the vicinity of discharge probe, that is the "exhaust pipe dimension" is 50 mm, as in the previous description) in order to accurately grasp the cleaning conditions of the reaction chamber (film formation chamber). To this end, it is necessary to set the excitation electrode dimension ratio (excitation electrode dimension/exhaust pipe dimension) to 50% or less (in the example of coaxial type in FIG. 25, the diameter of the excitation electrode of the discharge probe tip portion is 25 mm or less) in order to prevent the peripheral portion of the plasma from reaching the inner wall of the exhaust pipe when the excitation electrode is located at the center of the exhaust pipe. It is desirable to set the ratio to 30% or less (in the example in FIG. 25, the diameter of the excitation electrode of the discharge probe tip portion is 15 mm or less) in order to obtain information about only the center portion of the exhaust pipe in which the flow rate is high. Further, it is desirable to set the ratio to 20% or less (in the example in FIG. 25, the diameter of the excitation electrode of the discharge probe tip portion is 10 mm or less) in order to obtain information about only the center portion of the exhaust pipe in which the flow rate is high with high precision and high response.

The description given here of the excitation electrode dimension ratio also applies almost similarly to the case where the discharge probe tip portion is located in the vicinity of the intermediate wall of the exhaust pipe. The reason is that when the discharge probe tip portion is located in the vicinity of the intermediate wall of the exhaust pipe as in FIG. 2 and FIG. 21 (flat-plate type), the expansion of the local plasma in the transverse direction is generally limited to a certain degree by the ground electrode, and therefore, the expansion of the local plasma in the axial direction of the discharge probe mainly causes a problem. That is, because it is important for the plasma not to reach the inner wall (including the inner wall obliquely ahead in consideration of the fluctuation of the plasma) in opposition to the exhaust pipe. If the plasma reaches the wall portion, information about the deposit at the point of time in the past, different from the present time, is picked up as noises.

The above also applies to the case where the discharge probe tip portion is installed in the film formation chamber 52 as well as the case where it is installed in the exhaust pipe. In this case, if the local plasma is too large, there is a possibility that the detection precision is adversely affected and the cleaning characteristics and the film formation chamber itself are adversely affected.

11. Summary

The invention made by the present inventors has been described in reference to preferred embodiments thereof. However, the invention is not limited thereto and it is obvious that these details may be modified in various ways without departing from the gist of the invention.

For example, the CVD process of the silicon oxide film is described mainly in reference to the preferred embodiments. However, the invention is not limited thereto and it is obvious that the invention can be applied to the CVD process of SiN and other insulating films, tungsten and other metal films, titan nitride and other metal nitride films, ruthenium oxide and other metal oxide films, etc.

Further, the cleaning end point by a remote plasma (cleaning gas is $NF_3$) is described in reference to preferred embodiments. However, the invention is not limited thereto and it is obvious that the invention can be applied to a case where cleaning is performed by introducing a cleaning gas ($ClF_3$ etc.) without plasma excitation in a processing chamber.

Furthermore, the single wafer processing furnace of inductively coupled plasma furnace type is taken as an example and described in detail as to the type of a plasma furnace. However, the invention is not limited thereto and it is obvious that the invention can be applied to the cyclotron type and the parallel flat-plate type. It is also obvious that the invention can be applied to the thermal CVD furnace for forming a film without plasma and the CVD furnace of batch type.

What is claimed is:

1. A manufacturing method of a semiconductor integrated circuit device, comprising the steps of:
   (a) introducing a first wafer in a wafer processing chamber of a plasma CVD apparatus having a first plasma excitation system;
   (b) performing a plasma CVD process on the first wafer introduced in the wafer processing chamber by plasma excitation using the first plasma excitation system;
   (c) after the step (b), discharging the first wafer to the outside from the wafer processing chamber;
   (d) after the step (c), performing remote plasma cleaning to the wafer processing chamber;
   (e) introducing a second wafer in the wafer processing chamber to which the remote plasma cleaning has been performed; and
   (f) performing the plasma CVD process on the second wafer introduced in the wafer processing chamber by plasma excitation using the first plasma excitation system,
   wherein the step (d) includes the sub steps of:
      (d1) plasma-exciting a cleaning gas using a second plasma excitation system in a remote plasma generation chamber provided outside the wafer processing chamber and transferring the excited cleaning gas into the wafer processing chamber;
      (d2) generating a local plasma in the wafer processing chamber or in a vacuum pumping system for evacuating the wafer processing chamber by plasma-exciting the cleaning gas using a third plasma excitation system of capacitively coupled type;
      (d3) detecting an end point of the remote plasma cleaning by monitoring electrical characteristic of the local plasma; and
      (d4) ending the remote plasma cleaning based on the result of the sub step (d3), and
   wherein the third plasma excitation system has an excitation antenna portion and a tip portion of the excitation antenna portion is inserted into the wafer processing chamber or the vacuum pumping system.

2. The manufacturing method of a semiconductor integrated circuit device according to claim 1,
   wherein the tip portion is inserted into the vacuum pumping system.

3. The manufacturing method of a semiconductor integrated circuit device according to claim 2,
   wherein the tip portion includes:
      (i) an excitation electrode portion substantially exposed; and
      (ii) a ground electrode portion provided in close proximity to the excitation electrode portion in an electrically isolated state, and substantially exposed.

4. The manufacturing method of a semiconductor integrated circuit device according to claim 3,
   wherein the excitation antenna portion is of monopole type.

5. The manufacturing method of a semiconductor integrated circuit device according to claim 4,
   wherein the electrical characteristic is an impedance of the local plasma or a physical quantity corresponding thereto.

6. The manufacturing method of a semiconductor integrated circuit device according to claim 5,
   wherein the impedance or the physical quantity corresponding thereto is a plasma voltage, a self-bias voltage, or a plasma current of the local plasma.

7. The manufacturing method of a semiconductor integrated circuit device according to claim 4,
   wherein the vacuum pumping system has a turbomolecular pump and the tip portion is inserted into the vacuum pumping system between the wafer processing chamber and the turbomolecular pump.

8. The manufacturing method of a semiconductor integrated circuit device according to claim 7,
   wherein the area of the excitation electrode portion is less than 1% of the area of a single main surface of the first wafer.

9. The manufacturing method of a semiconductor integrated circuit device according to claim 7,
   wherein the area of the excitation electrode portion is less than 0.5% of the area of a single main surface of the first wafer.

10. The manufacturing method of a semiconductor integrated circuit device according to claim 7,
wherein the area of the excitation electrode portion is less than 0.3% of the area of a single main surface of the first wafer.

11. The manufacturing method of a semiconductor integrated circuit device according to claim 7,
wherein the area of the excitation electrode portion is less than 0.1% of the area of a single main surface of the first wafer.

12. A manufacturing method of a semiconductor integrated circuit device, comprising the steps of:
(a) introducing a first wafer in a wafer processing chamber of a thermal CVD apparatus;
(b) performing a thermal CVD process on the first wafer introduced in the wafer processing chamber;
(c) after the step (b), discharging the first wafer to the outside from the wafer processing chamber;
(d) after the step (c), performing remote plasma cleaning of the wafer processing chamber;
(e) introducing a second wafer in the wafer processing chamber to which the remote plasma cleaning has been performed; and
(f) performing the thermal CVD process on the second wafer introduced in the wafer processing chamber,
wherein the step (d) includes the sub steps of:
(d1) plasma-exciting a cleaning gas using a first plasma excitation system in a remote plasma generation chamber provided outside the wafer processing chamber and transferring the excited cleaning gas into the wafer processing chamber;
(d2) generating a local plasma in the wafer processing chamber or in a vacuum pumping system for evacuating the wafer processing chamber by plasma-exciting the cleaning gas using a second plasma excitation system of capacitively coupled type;
(d3) detecting an end point of the remote plasma cleaning by monitoring electrical characteristic of the local plasma; and
(d4) ending the remote plasma cleaning based on the result of the sub step (d3), and
wherein the second plasma excitation system has an excitation antenna portion and a tip portion of the excitation antenna portion is inserted into the wafer processing chamber or the vacuum pumping system.

13. The manufacturing method of a semiconductor integrated circuit device according to claim 12,
wherein the tip portion is inserted into the vacuum pumping system.

14. The manufacturing method of a semiconductor integrated circuit device according to claim 12,
wherein the tip portion includes:
(i) an excitation electrode portion substantially exposed; and
(ii) a ground electrode portion provided in close proximity to the excitation electrode portion in an electrically isolated state, and substantially exposed.

15. The manufacturing method of a semiconductor integrated circuit device according to claim 14,
wherein the excitation antenna portion is of monopole type.

16. The manufacturing method of a semiconductor integrated circuit device according to claim 14,
wherein the area of the excitation electrode portion is less than 1% of the area of a single main surface of the first wafer.

17. A manufacturing method of a semiconductor integrated circuit device, comprising the steps of:
(a) introducing a first wafer in a wafer processing chamber of a thermal CVD apparatus;
(b) performing a thermal CVD process on the first wafer introduced in the wafer processing chamber;
(c) after the step (b), discharging the first wafer to the outside from the wafer processing chamber;
(d) after the step (c), performing remote plasma cleaning of the wafer processing chamber;
(e) introducing a second wafer in the wafer processing chamber to which the remote plasma cleaning has been performed; and
(f) performing the thermal CVD process on the second wafer introduced in the wafer processing chamber,
wherein the step (d) includes the sub steps of:
(d1) plasma-exciting a cleaning gas using a first plasma excitation system in a remote plasma generation chamber provided outside the wafer processing chamber and transferring the excited cleaning gas into the wafer processing chamber;
(d2) generating a local plasma in the wafer processing chamber or in a vacuum pumping system for evacuating the wafer processing chamber by plasma-exciting the cleaning gas using a second plasma excitation system of capacitively coupled type;
(d3) detecting an end point of the remote plasma cleaning by monitoring electrical characteristic of the local plasma; and
(d4) ending the remote plasma cleaning based on the result of the sub step (d3), and
wherein the electrical characteristic is an impedance of the local plasma or a physical quantity corresponding thereto.

18. A manufacturing method of a semiconductor integrated circuit device, comprising the steps of:
(a) introducing a first wafer in a wafer processing chamber of a plasma CVD apparatus having a first plasma excitation system;
(b) performing a plasma CVD process on the first wafer introduced in the wafer processing chamber by plasma excitation using the first plasma excitation system;
(c) after the step (b), discharging the first wafer to the outside from the wafer processing chamber;
(d) after the step (c), performing remote plasma cleaning of the wafer processing chamber;
(e) introducing a second wafer in the wafer processing chamber to which the remote plasma cleaning has been performed; and
(f) performing the plasma CVD process on the second wafer introduced in the wafer processing chamber by plasma excitation using the first plasma excitation system,
wherein the step (d) includes the sub steps of:
(d1) plasma-exciting a cleaning gas using a second plasma excitation system in a remote plasma generation chamber provided outside the wafer processing chamber and transferring the excited cleaning gas into the wafer processing chamber;
(d2) generating a local plasma in a vacuum pumping system for evacuating the wafer processing chamber by plasma-exciting the cleaning gas using a third plasma excitation system of capacitively coupled type;

(d3) detecting an end point of the remote plasma cleaning by monitoring electrical characteristic of the local plasma; and (d4) ending the remote plasma cleaning based on the result of the sub step (d3), wherein the third plasma excitation system has an excitation antenna portion and the tip portion of the excitation antenna portion is inserted into the vacuum pumping system, including:

(i) an excitation electrode portion substantially exposed; and (ii) a ground electrode portion provided in close proximity to the excitation electrode portion in an electrically isolated state, and substantially exposed; and wherein an excitation electrode dimension ratio of the excitation electrode portion is 50% or less.

19. The manufacturing method of a semiconductor integrated circuit device according to claim 18, wherein the excitation electrode dimension ratio is 30% or less.

20. The manufacturing method of a semiconductor integrated circuit device according to claim 18, wherein the excitation electrode dimension ratio is 20% or less.

21. The manufacturing method of a semiconductor integrated circuit device according to claim 18, wherein the excitation antenna portion is of monopole type.

22. The manufacturing method of a semiconductor integrated circuit device according to claim 18, wherein the electrical characteristic is an impedance of the local plasma or a physical quantity corresponding thereto.

23. The manufacturing method of a semiconductor integrated circuit device according to claim 22, wherein the impedance or the physical quantity corresponding thereto is a plasma voltage, a self-bias voltage, or a plasma current of the local plasma.

24. The manufacturing method of a semiconductor integrated circuit device according to claim 18, wherein the tip portion of the excitation antenna portion is located at the center portion of the exhaust pipe or in the vicinity thereof.

25. The manufacturing method of a semiconductor integrated circuit device according to claim 18, wherein the excitation antenna portion is of coaxial type.

26. The manufacturing method of a semiconductor integrated circuit device according to claim 18, wherein the excitation antenna portion excites a plasma by silent discharge.

27. The manufacturing method of a semiconductor integrated circuit device according to claim 18, wherein the step (d) further includes the sub step of:

(d5) before the sub steps (d1) to (d3), cleaning the tip portion by plasma excitation using the third plasma excitation system while flowing an inert gas around the tip portion of the excitation antenna portion.

* * * * *